United States Patent [19]
Kondo et al.

[11] Patent Number: 5,526,393
[45] Date of Patent: Jun. 11, 1996

[54] SYNCHRONOUS COUNTER

[75] Inventors: Mitsuaki Kondo, Inazawa; Takamoto Watanabe, Nagoya, both of Japan

[73] Assignee: Nippondenso Co., Ltd., Kariya, Japan

[21] Appl. No.: 405,152

[22] Filed: Mar. 16, 1995

[30] Foreign Application Priority Data

Mar. 16, 1994 [JP] Japan .................. 6-045562

[51] Int. Cl.⁶ .................. H03K 21/02; H03K 23/40
[52] U.S. Cl. .................. 377/118; 377/106; 377/111; 377/116
[58] Field of Search .................. 377/49, 47, 55, 377/111, 114, 116, 106, 118

[56] References Cited

U.S. PATENT DOCUMENTS

| | | | |
|---|---|---|---|
| 4,679,216 | 7/1987 | Iida et al. | 377/106 |
| 4,741,006 | 4/1988 | Yamaguchi et al. | 377/116 |
| 4,759,043 | 7/1988 | Lewis | 377/116 |
| 5,355,396 | 10/1994 | Tai | 377/55 |

FOREIGN PATENT DOCUMENTS

| | | |
|---|---|---|
| 62-217722 | 9/1987 | Japan. |
| 537361 | 2/1993 | Japan. |

*Primary Examiner*—John S. Heyman
*Attorney, Agent, or Firm*—Cushman, Darby & Cushman

[57] ABSTRACT

A synchronous counter comprises one D flip-flop circuit for performing divide-by-2 frequency division of a clock signal CK, JK flip-flop circuits for, when input signals have HIGH levels (logical value 1), inverting the levels of the output signals in synchronization with the clock signal CK, logic circuits for inputting control signals to the JK flip-flop circuits, lower-stage signal assembling circuits for grouping the output signals from the JK flip-flop circuits into two-signal-unit groups to produce logical product signals of the signals in these two,signal-unit groups, and upper-stage signal assembling circuits for further handling the output signals from the lower-stage signal assembling circuits, thereby firstly simultaneously satisfying an increase in speed of the counting operation as well as simplification of the wiring pattern and reduction in the circuit area and secondly realizing further increase in the counting operation.

16 Claims, 18 Drawing Sheets

5,526,393

SYNCHRONOUS COUNTER

CROSS REFERENCE TO RELATED APPLICATION

This application is based upon and claims the benefit of priority of the prior Japanese Patent application No. 6-45562 filed on Mar. 16, 1994, the contents of which are incorporated herein by reference.

BACKGROUND OF THE INVENTION

1. Field of the Invention

The present invention relates to a counter employed in a pulse phase difference encoding circuit, time to digital conversion circuit, etc., or a synchronous counter employed in a clock-controlled PLL and the like. In particular, the invention concerns a synchronous counter intended to enable performance of higher-speed clock operations and multi-bit arrangements.

2. Related Arts

While a level-inversion counter has a circuit which is adapted to input a clock signal having a given frequency value and count the number of periodic cycles of this clock signal in order to output the-same, as examples of such a type of counter, the convention counter circuit shown in FIG. 13 and the conventional counter circuit shown in FIG. 14 are publicly known.

The counter circuit shown in FIG. 13 is a counter circuit in which more multi-input AND circuits are connected as the bit order increases from a lower bit-order toward a higher bit-order. This counter circuit is designed such that output signals of logic circuits for producing logical products of output signals from preceding flip-flop circuits are supplied to flip-flop circuits Q1 to Q15. This counter circuit, however, has a drawback in that although it theoretically operates at maximum speed, an increase in the number of bits used causes an exponential increase in the number of transistor elements necessary to form the relevant logic circuits. This results in the necessity of using a significantly large element area, while the wiring also becomes very complicated, rendering the counter circuit impractical.

The counter circuit shown in FIG. 14 is a counter circuit in which the number of within-circuit elements and the amount of wiring are reduced over the counter circuit shown in FIG. 13. In this counter circuit, AND circuits are connected in series in order to reduce the number of elements and the amount of wiring. In this type of synchronous counter, however, since the output signals from carrying gate circuits within the counter are serially arranged and sequentially transferred to their upper-order bit elements, with the result that the time delays of the signals accumulate, it happens in some cases that the counter is operated by a higher-speed clock signal and erroneous operations occur due to the accumulation of the above-mentioned time delays. For this reason, this synchronous counter has a problem in that when it is used with a multi-bit element arrangement, acceleration of the operations thereof cannot be satisfactorily realized.

Under the above-mentioned circumstances, development of a synchronous counter capable of simultaneously solving the two above-mentioned problems, i.e., a synchronous counter compatible with accelerated operation and reduction of the circuit area has hitherto been in demand.

As such a synchronous counter, proposed in view of the above-mentioned problems, a counter such as that disclosed in, for example, Published Unexamined Japanese Patent Application No. 62-217722 has been known. FIGS. 15 through 17 are views showing the circuit of the above publication. The counter circuit shown in FIG. 15 is one in which the output Q0 of the (0)th bit flip-flop circuit that is most frequently inverted is commonly inputted to each of the flip-flop circuits, thereby realizing high-speed operation compared to the circuit shown in FIG. 14. Further, the counter circuit shown in FIG. 16 is one in which the output signal Q1 of the flip-flop circuit that is the next most frequently inverted, as well as the output signal Q0 of the (0)th bit flip-flop circuit, is commonly inputted to the succeeding flip-flop circuits, thereby realizing accelerated operation of the circuit. However, in cases where the relevant circuits are actually formed on a wiring board, wiring of two common wire lines with respect to each of the flip-flop circuits disadvantageously results in complication of the wiring pattern and a subsequent decrease in the degree of freedom of the wiring pattern. FIG. 17 shows a circuit which solves this problem and in which the two output signals Q0 and Q1 are combined into one common line.

The operation of the counter circuit shown in FIG. 15 will now be described with reference to the time chart shown in FIG. 18, explanation in this case being limited to the bit range from the count signal Q0 to the count signal Q7 and a state where the counter exhibits greatest variation, namely where each and every bit involved exhibits variation. The time when the count signal Q7, which is an upper-order bit count signal, changes in FIG. 15 corresponds to the timing with which the clock signal CK has changed from a LOW state (logical value 0) to a HIGH state during a time period in which each of the count signals Q0 to Q6 is in a HIGH state (logical value 1). Explanation will begin from a point corresponding to a state (wherein the count signal Q1 is in a LOW state and all the count signals Q2 to Q6 are in HIGH states) preceding by two clock pulses the state wherein all the count signals Q0 to Q6 are in HIGH states. When in FIG. 15 the clock signal CK changes from LOW state to HIGH state as indicated in the time chart of FIG. 18, the count signal Q0 changes to LOW state and the count signal Q1 changes to HIGH state. As a result, the input signals of the element represented by the numeral 14 both change to HIGH state and the output signals thereof change to HIGH state. Similarly, since the input signals of the element represented by the numeral 16 both change to HIGH state, the output signals thereof also change to HIGH state. As mentioned above, the output signals of the elements 14, 16, 18, 20, and 22 change to HIGH state while they are delayed sequentially from the lower-order bit side. The circuit show in FIG. 15 achieves a reduction in the number of elements employed by utilizing the above-mentioned structure.

However, while the synchronous counter disclosed in Japanese Patent Unexamined Publication No. 62-217722 frequently inverts the lower-order bit count signals Q0 and Q1, which cause production of time delays, and commonly input them to succeeding flip-flop circuits by providing common lines thereto, thereby realizing a higher-speed operation than in the prior art, any specific change other than in the case of the synchronous counter of FIG. 14 does not basically occur with respect to such succeeding flip-flop circuits. Therefore, the synchronous counter disclosed above still has the problem that time delays accumulate. From the viewpoint in the above publication, in cases where higher-speed operation is desired, this results in the count signals being further commonly inputted sequentially from lower-order bit count signals. This disadvantageously raises such problems as, for example, complication of the wiring pattern, decrease in the degree of freedom of the wiring pattern, etc. Accordingly, in the synchronous counter disclosed in the above publication, there has been the problem that higher-speed operation, simplification of the wiring pattern, and reduction in the circuit area cannot be simultaneously satisfied.

SUMMARY OF THE INVENTION

The present invention has been conceived in view of the above-mentioned circumstances, one object thereof being to provide a synchronous counter which is capable of simultaneously realizing high-speed operations and simplification of the wiring pattern/reduction of the circuit area. Another object of the present invention is to provide a synchronous counter which is capable of realizing an again-higher-operation.

The synchronous counter of a first invention, constructed in order to achieve the above object, includes: an arithmetic operation circuit, having (n+1) flip-flop circuits and a clock signal inputted thereto, for operating in synchronization with the clock signal and inverting the levels of count signals composing (n+1) output signals from the least significant (0)th bit to the most significant (n)th bit output signals, to thereby represent the level inversion frequency of the clock signals as a count signal; and a control circuit including a plurality of control signal output circuits having from the (0)th to the (i)th (where $1 \leq i \leq (n-1)$) bit count signals inputted therein from among the count signals, producing logical product signals of the (0)th to (i)th bit count signals to form control signals corresponding to the flip-flop circuits, and outputting these control signals to the arithmetic operation circuit to thereby invert the levels of the output signals from the first to the (i+1)th flip-flop circuits, wherein the control circuit further comprises wiring groups for allowing the passage therethrough of a plurality of count-signal groups in which the count signals are assembled in sequence from the least significant bit, and a plurality of signal assembling circuits for producing logical product signals of the count signals in the count-signal groups, and the control circuit is arranged to supply control signals from the signal assembling circuits to a flip-flop circuit higher in bit order than any of the count signals composing the count-signal groups.

In the synchronous counter of the first invention, the control circuit preferably includes first, second, and third wiring groups allowing the passage therethrough of first, second, and third count-signal groups in which the count signals in sequence from the least significant bit are assembled, a first signal assembling circuit for producing a logical product signal of the count signals in the first count-signal group, a second signal assembling circuit for producing a logical product signal of the count signals in the second count-signal group, and a third signal assembling circuit for producing a logical product signal of the output signals from the first and second signal assembling circuits, wherein the control circuit is preferably arranged to supply the control signals from the output signals of the third signal assembling circuit to a flip-flop circuit higher in bit order than any of the count signals composing the first and second count-signal groups.

Further, the synchronous counter of a second invention, constructed in order to achieve the above object, comprises: an arithmetic operation circuit, having (n+1) flip-flop circuits and a clock signal inputted thereto, for operating in synchronization with the clock signal and inverting the levels of the count signals composing (n+1) output signals from the least significant (0)th bit to the most significant (n)th bit output signals, to thereby represent the level inversion frequency of the clock signals as a count signal; and a control circuit including a plurality of control signal output circuits having from the (0)th to the (i)th (where $1 \leq i \leq (n-1)$) bit count signals inputted therein from among the count signals, producing logical sum signals of the (0)th to (i)th bit count signals to form control signals corresponding to the flip-flop circuits, and outputting these control signals to the arithmetic operation circuit to thereby invert the levels of the output signals from the first to the (i+1)th flip-flop circuits, wherein the control circuit further includes wiring groups for allowing the passage therethrough of a plurality of count-signal groups in which the count signals are assembled in sequence from the least significant bit, and a plurality of signal assembling circuits for producing logical product signals of the count signals in the count-signal groups, and the control circuit is arranged to supply control signals from the output of the signal assembling circuits and the (0)th bit count signal to a flip-flop circuit higher in bit order than any of the count signals composing the count-signal groups.

It is to be noted that in the second invention the control signal output circuits preferably include the first to the (j)th (where $2 \leq j \leq (n-1)$) control signal output circuits, the first control signal output circuit having inputted thereto the count signal from the first flip-flop circuit and the count signal from the second flip-flop circuit, thereby forming a control signal with respect to the third flip-flop circuit according to both count signals, while the second to (j)th control signal output circuits have inputted thereto logical product signals of the count signal from the first flip-flop circuit and the count signals from the second to the (j)th flip-flop circuits, thereby forming control signals with respect to the third to the (j+1)th flip-flop circuits according to the logical product signals.

Also, in the first or second invention, the signal assembling circuit preferably produces a logical product signal by parallel-inputting the count signals in the corresponding count-signal group.

Further, in the synchronous counter of the first or second invention, the number (n) of the flip-flop circuits composing the arithmetic operation circuit is a positive integer of not less than 7, and the number of the serially arranged signal assembling circuits from the signal assembling circuit for producing the first-bit flip-flop circuit count signal to the signal assembling circuit for producing the control signal inputted to the (n)th bit flip-flop circuit is less than that obtained by dividing (n+1) by 2.

Further, the synchronous counter of a third invention constructed in order to achieve the above object comprises: an arithmetic operation circuit, having (n+1) flip-flop circuits and a clock signal inputted thereto, for operating in synchronization with the clock signal and inverting the levels of count signals composing (n+1) output signals from the least significant (0)th bit to the most significant (n)th bit output signals, to thereby represent the level inversion frequency of the clock signals as a count signal; and a control circuit including a plurality of control signal output circuits having from the (0)th to the (i)th (where $1 \leq i \leq (n-1)$) bit count signals inputted therein from among the count signals, producing logical product signals of the (0)th to (i)th bit count signals to form control signals corresponding to the flip-flop circuits, and outputting these control signals to the arithmetic operation circuit to thereby invert the levels of the output signals from the first to the (i+1)th flip-flop circuits, wherein the control circuit further includes first and second wiring groups which allow passage therethrough of the count signals in the first and second count-signal groups in which the count signals in sequence from the lower-order bit are plurally assembled, and a signal assembling circuit which is a final control signal outputting circuit in the first count-signal group for producing a logical product signal of all the count signals in the first count-signal group, and the control signal outputting circuit has inputted thereto the count signals in the second count-signal group, arranged to obtain from the output signals of the signal assembling circuit the logical product signals of the count signals lower in bit order than any of the count signals composing the second count-signal group, and the control circuit is arranged to supply control signals from the signal assembling circuits to the flip-flop circuits corresponding to the count signals composing the second count-signal group.

Note that in the synchronous counter of the first to third inventions, the count-signal group is preferably composed of two or three count signals.

Also, the first flip-flop circuit preferably obtains the count signal corresponding to the (0)th bit, which is the least significant bit, by performing frequency division of the clock signal, a count signal outputted from the first flip-flop circuit is supplied to the second flip-flop circuit as a control signal, the second flip-flop circuit inverting the level of the (1)th bit count signal in synchronization with the clock signal when this control signal has one logical level, and control signals are inputted to the third to (n+1)th flip-flops, which invert the levels of the second to (n)th bit count signals in synchronization with the clock signals when the control signals have logical levels of one.

According to the synchronous counter of the first invention constructed as mentioned above, signal assembling circuits which, with the count signals plurally assembled into count-signal groups in sequence from lower-order bit element count signals, produce logical product signals of the count signals in the count-signal groups in count-signal-group units, are provided within the control circuit. The control circuit is designed such that, when producing the control signals with respect to the flip-flop circuits in the arithmetic operation circuit, the control circuit obtains from the signal assembling circuits the logical product signals of partial count signals in the count-signal groups which are among the logical product signals of the count signals. By reducing the number of serial connections between circuits by providing the signal assembling circuits in count-signal-group units as mentioned above, accumulation of signal time delays is decreased. Further, by providing the signal assembling circuits in count-signal-group units and further providing the third signal assembling circuits for assembling the output signals from those signal assembling circuits, the number of serial connections between circuits can be reduced, thereby decreasing accumulation of signal time delays.

According to the synchronous counter of the first invention, by providing the control circuit therewithin with the signal assembling circuits in count-signal-group units, the number of serial connections between circuits is decreased, thereby enabling reduction of signal time delays. In addition, since a method of providing common wire lines and causing clock signals to be commonly inputted to corresponding circuit elements is not employed, it is possible to simultaneously achieve high-speed operation, simplification of the wiring pattern and reduction of the circuit area.

Further, according to the synchronous counter of the second invention, within the control circuit, the count signals are plurally sequentially assembled from lower-order bit elements into count-signal groups and there are provided signal assembling circuits for producing logical product signals of the count signals in the count-signal group in count-signal-group units. When forming the control signals with respect to the flip-flop circuits in the arithmetic operation circuit, the control circuit obtains from the signal assembling circuits the logical product signals of partial count signals of the count signals in the count-signal groups which are among the logical product signals of count signals other than the signal from the (0)th flip-flop circuit, and then procures the logical product signal of those logical sum signals and the count signal from the (0)th flip-flop circuit and outputs it to the flip-flop circuits. By providing the signal assembling circuits in count-signal-group units and thereby reducing the number of serial connections between circuits as mentioned above, accumulation of the signal time delays is reduced. Further, by providing a single common wire line and causing the count signal from the (0)th flip-flop circuit, which is most frequently inverted, to be commonly inputted to the relevant flip-flop circuits, it is possible to realize a still higher-speed operation.

If the signal assembling circuits are designed to input in parallel the count signals in the count-signal groups and produce logical product signals thereof, it is possible to further reduce the accumulation of signal time delays.

Further, according to the synchronous counter of the third invention, the control circuit has first and second count-signal groups and signal assembling circuits for producing logical product signals of all the count signals in the first count-signal group. Also, the control signal outputting circuits for inputting the count signals in the second count-signal group obtain, from the signal assembling circuit, logical product signals of the count signals that precede the count signals in the first count-signal group and produce control signals corresponding to the flip-flop circuits that are higher in bit order than the flip-flop circuits corresponding to the count-signal groups. By providing the signal assembling circuits in count-signal-group units and reducing the number of serial connections between circuits as mentioned above, accumulation of signal time delays can be reduced.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A synchronous counter according to a first embodiment of the present invention will now be described with reference to the drawings.

Figure 1:
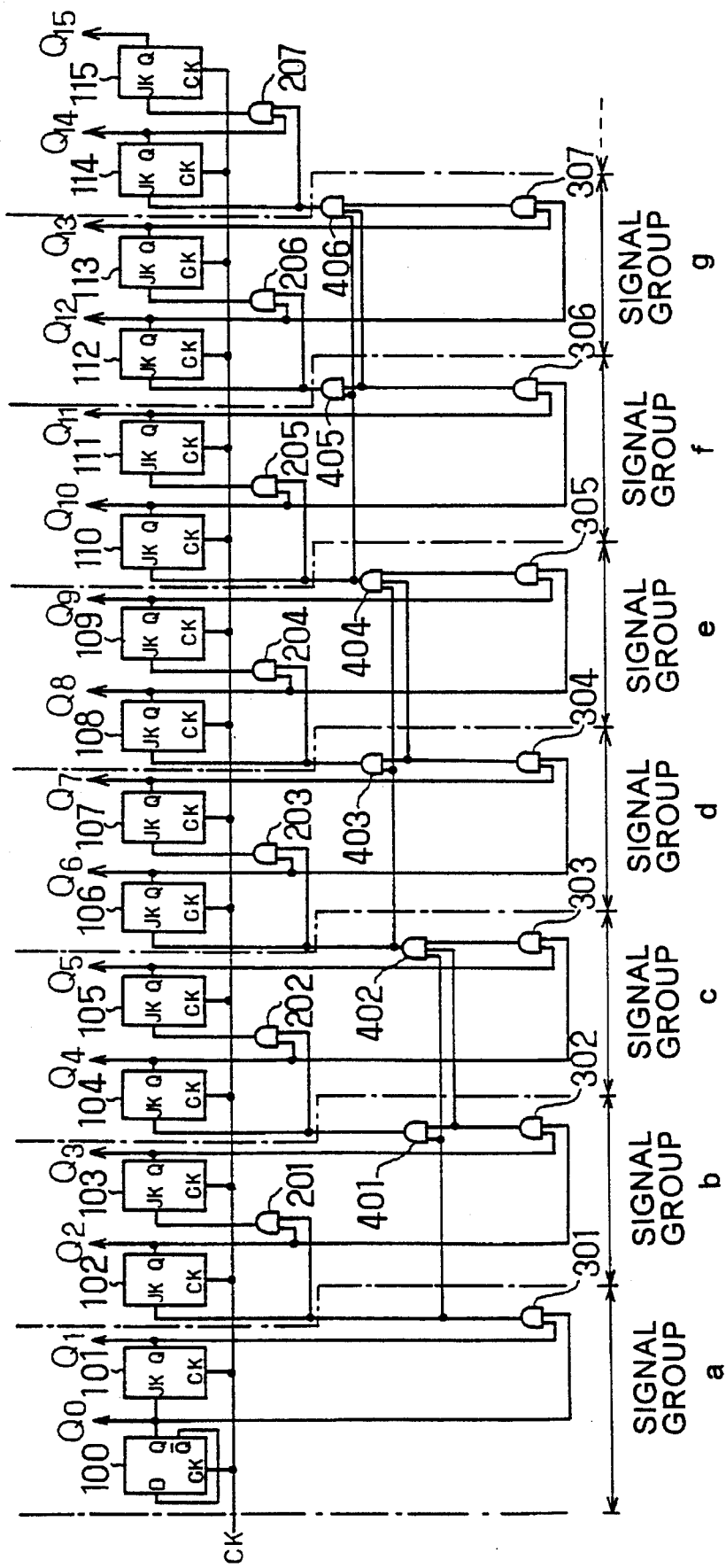
FIG. 1 is a circuit diagram showing a synchronous counter according to a first embodiment of the present invention.

FIG. 1 shows a counter circuit according to the first embodiment of the present invention. In FIG. 1, schematically, the counter circuit comprises a single-piece D flip-flop circuit 100 for performing divide-by-2 frequency division of a clock signal CK, JK flip-flop circuits 101 to 115 (corresponding to flip-flop circuits) for inverting the levels of the output signals in synchronization with the clock signal CK when the input signals thereof are in their HIGH state (logical value 1), logic circuits 201 to 207 for inputting the control signals to the JK flip-flop circuits, lower-stage signal assembling circuits 301 to 307 (corresponding to signal assembling circuits; two adjacent logic circuits of these circuits correspond to first and second signal assembling circuits) for assembling the output signals from the JK flip-flop circuits 101 to 115 into two-signal groups and producing logical product signals of the signals in those two-signal groups, and upper-stage signal assembling circuits 401 to 406 (which correspond to third signal assembling circuits) for further group-assembling output signals from the lower-stage signal assembling circuits 301 to 307.

Since in this first embodiment the output signals from the flip-flop circuits are assembled into two-signal groups, a signal group (a) is composed of the output signal from the D flip-flop circuit 100 and the output signal from the JK flip-flop circuit 101 as shown in FIG. 1. In this manner, the signal groups (b) to (g) are respectively composed of the output signals from the JK flip-flop circuits 102 to 103, 104 to 105, 106 to 107, 108 to 109, 110 to 111, 112 to 113, and 114 to 115.

It is to be noted that the output signal Q from the D flip-flop circuit 100 is produced as a count signal Q0 from the least significant bit, namely (0)th bit, flip-flop circuit.

The output signals Q from the flip-flop circuits 101 to 115 are produced as the count signals Q1, Q2, ... Q15 from the (1)th and succeeding bit flip-flop circuits. In this embodiment the D flip-flop circuit 100 and the JK flip-flop circuits 101 to 115 compose an arithmetic operation circuit.

The functions of the respective constituent elements will briefly be explained below. First, the first-stage JK flip-flop circuit 101 has the count signal Q0 from the D flip-flop circuit 100 supplied thereto as an input signal JK.

In the signal group (a), the lower-stage signal assembling circuit 301 is a single AND circuit to which the count signal Q0 from the D flip-flop circuit 100 and the count signal Q1 from the JK flip-flop circuit 101 are supplied in parallel. This circuit 301 corresponds to the signal assembling circuit for the signal group (a) and produces a control signal which is supplied to the second-stage JK flip-flop circuit 102.

In the signal group (b), the logic circuit 201 is a single AND circuit to which the output signal from the lower-stage signal assembling circuit 301 and the count signal Q2 from the JK flip-flop circuit 102 are supplied in parallel, forming a control signal with respect to the JK flip-flop circuit 103. The lower-stage signal assembling circuit 302 is a single AND circuit to which the count signal Q2 from the flip-flop circuit 102 and the count signal Q3 from the JK flip-flop circuit 103 are supplied in parallel, and this circuit 302 corresponds to the signal assembling circuit for the signal group (b). Further, the upper-stage signal assembling circuit 401 (corresponding to the third signal assembling circuit) is a single AND circuit for producing a logical product signal of the output signal from the lower-stage signal assembling circuit 301, which is the signal assembling circuit for the signal group (a), and the output signal from the lower-stage signal assembling circuit 302, which is the signal assembling circuit for the signal group (b), this circuit 401 forming a control signal to the fourth-stage JK flip-flop circuit 104.

Thereafter, similarly, the lower-stage signal assembling circuits 303, 304, 305, 306, and 307 are AND circuits to which the count signals from the flip-flop circuits 104–105, 106–107, 108–109, 110–111, and 112–113 are respectively supplied in parallel, and correspond to the respective signal assembling circuits for the signal groups c, d, e, f, and g. Also, the upper-stage signal assembling circuit 402 is a single AND circuit for producing a logical product signal of the output signals from the lower-stage signal assembling circuits for the signal groups (a) to (c), forming a control signal with respect to the JK flip-flop circuit 106. The upper-stage signal assembling circuit 403 is a single AND circuit for producing a logical product signal of the output signal from the upper-stage signal assembling circuit 402 and the output signal from the lower-stage signal assembling circuit 304 for the signal group (d), forming a control signal with respect to the JK flip-flop circuit 108. The upper-stage signal assembling circuit 404 is a single AND circuit for producing a logical product signal of the output signal from the upper-stage signal assembling circuit 402 and the output signals from the lower-stage signal assembling circuits 304 and 305 for the signal groups (d) and (e), forming a control signal with respect to the JK flip-flop circuit 110. The upper-stage signal assembling circuit 405 is a single AND circuit for producing a logical product signal of the output signal from the upper-stage signal assembling circuit 404 and the output signal from the lower-stage signal assembling circuit 306 for the signal group (f), forming a control signal with respect to the JK flip-flop circuit 112. The upper-stage signal assembling circuit 406 is a single AND circuit for producing a logical product signal of the output signal from the upper-stage signal assembling circuit 404 and the output signals from the lower-stage signal assembling circuits 306 and 307 for the signal groups (f) and (g), producing a control signal for the JK flip-flop circuit 114. The logic circuits 202, 203, 204, 205, 206, and 207 are single AND circuits to which the output signal from the upper-stage signal assembling circuit 401 and the count signal Q4, the output signal from the upper-stage signal assembling circuit 402 and the count signal Q6, the output signal from the upper-stage signal assembling circuit 403 and the count signal Q8, the output signal from the upper-stage signal assembling circuit 404 and the count signal Q10, the output signal from the upper-stage signal assembling circuit 405 and the count signal Q12, and the output signal from the upper-stage signal assembling circuit 406 and the count signal Q14 are supplied in parallel, respectively forming control signals with respect to the JK flip-flop circuits 105, 107, 109, 111, 113, and 115.

Next, the operation of the above-constructed synchronous counter circuit will now be described using the time chart of FIG. 2. However, in this case of the FIG. 2 time chart, the explanation of the signals to be assembled is limited to the 8-bit count signals from the count signal Q0 to the count signal Q7, and is also limited to the timing at which the counter exhibits the greatest variation, namely the timing at which all the counter bit signals exhibit changes.

Figure 2:
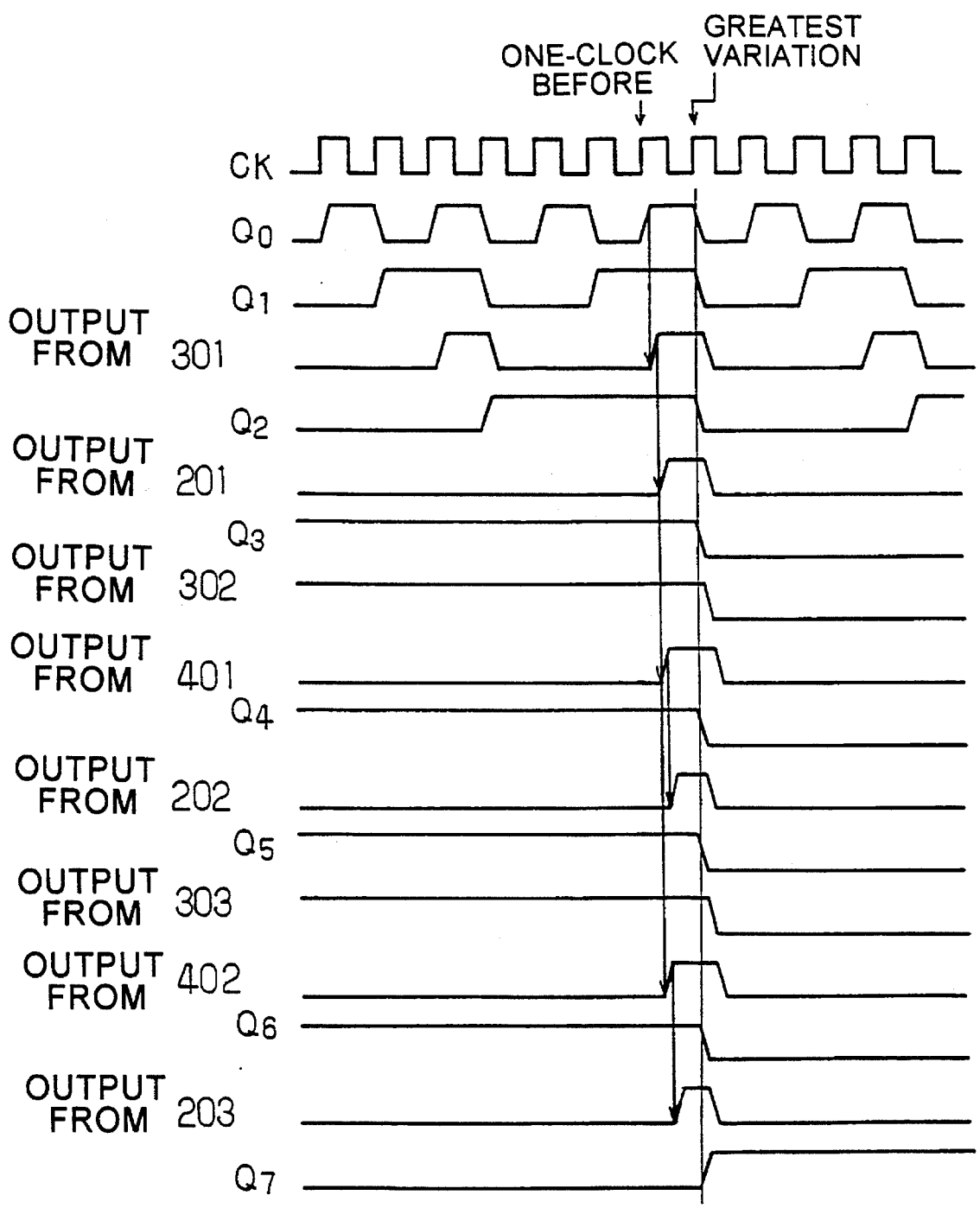
FIG. 2 is a time chart showing the signal operation of the synchronous counter shown in FIG. 1.

In FIG. 2, the time when the count signal Q7 from the upper-order bit element varies corresponds to the timing at which the clock signal CK has changed from a LOW state to a HIGH state during a time period in which the count signals from Q0 to Q6 are all in a HIGH state.

Considering the case of the clock signal state that precedes by one clock-pulse the clock signal stage in which the count signals from Q0 to Q6 are all in a HIGH state (Q0 is in a LOW state and the count signals of from Q1 to Q6 are all in a HIGH state), the output signals from the relevant elements are such that the output signal from the lower-stage signal assembling circuit 302 and the output signal from the lower-stage signal assembling circuit 303 are in a HIGH state, and the output signals from the remaining circuits are all in a LOW state.

When the clock signal CK changes from a LOW state to a HIGH state, the level of the count signal Q0 changes to a HIGH state. Since, as a consequence, the input signals of the lower-stage signal assembling circuit 301 both reach a HIGH level, the output signal from the lower-stage signal assembling circuit 301 changes to a HIGH level and the input signals of the upper-stage signal assembling circuit 401 and the upper-stage signal assembling circuit 402 all reach a HIGH level. Therefore, the output signals from the upper-stage signal assembling circuit 401 and the upper-stage signal assembling circuit 402 are at a HIGH level.

Further, since the output signal from the lower-stage signal assembling circuit 301 and the count signal Q2 are both at a HIGH level, the output signal from the logic circuit 201 is at a HIGH level. Also, similarly, the output signals from all the logic circuits and the output signals from all the upper/lower-stage signal assembling circuits change to a HIGH state.

As mentioned above, in the counter of this first embodiment, the output count signals from the flip-flop circuits are assembled in two-count-signal units, and lower-stage signal assembling circuits 301 to 307 for producing logical product signals of the count signals in these count-signal groups and upper-state signal assembling circuits 401 to 406 for further assembling the output signals from the lower-stage signal assembling circuits 301 to 307 are provided. As a result, the signal time delays which would otherwise accumulate due to the inversion operations of the flip-flop circuits and AND circuits operationally included in the count-signal groups are reduced.

Namely, in this embodiment, since no technique of providing common wire lines and causing relevant signals to be commonly inputted to their relevant circuits is employed, it is possible to simultaneously achieve high-speed operation as well as to simplify the wiring pattern and reduce the circuit area. Further, as regards the number of relevant elements, even if the number of bits is increased, the number of relevant elements is not exponentially increased, unlike conventional circuits.

Further, in this embodiment, since the time delay of the count signal Q0 can be sufficiently shortened, misoperations do not occur, with the result that higher-speed operation can be performed even when the frequency of the clock signal CK is increased over that of the prior art.

Note that the number of whole bits used in the counter circuits is not limited to a 16-bit arrangement (Q0 to Q15) but may be increased to a higher multi-bit arrangement.

(Second Embodiment)

A synchronous counter according to a second embodiment of the present invention will now be described hereunder with reference to the drawings.

Figure 3:
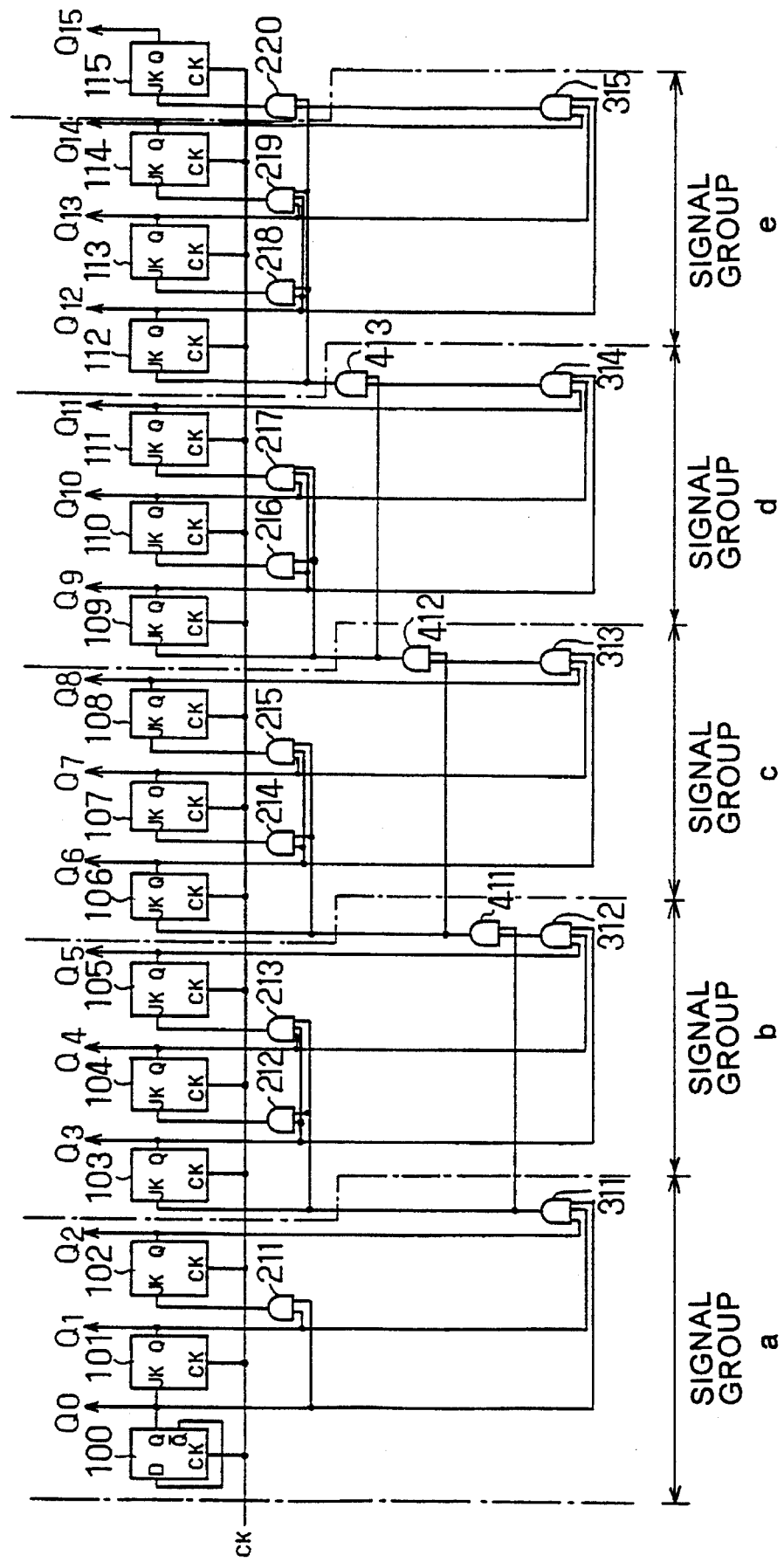
FIG. 3 is a circuit diagram showing a synchronous counter according to a second embodiment of the present invention.

FIG. 3 shows a counter circuit according to the second embodiment of the present invention. In FIG. 3, what differs from the arrangement according to the first embodiment is that the count signals from the JK flip-flop circuits are assembled in three-count-signal units in count-signal groups.

Schematically, the counter circuit comprises a single D flip-flop circuit 100 for performing divide-by-2 frequency division of the clock signal CK, JK flip-flop circuits 101 to 115 (corresponding to flip-flop circuits) for inverting the levels of the output signals thereof in synchronization with the clock signal CK when the input signals thereof are in their HIGH state (logical value 1), logic circuits 211 to 220 for inputting the control signals to the JK flip-flop circuits, lower-stage signal assembling circuits 311 to 315 (which correspond to signal assembling circuits; two adjacent logic circuits of these circuits correspond to first and second signal assembling circuits) for assembling the output signals from the JK flip-flop circuits 101 to 115 into three-signal groups and producing logical product signals of the signals in those three-signal groups, and upper-stage signal assembling circuits 411 to 413 (corresponding to third signal assembling circuits) for further assembling the output signals from the lower-stage signal assembling circuits 311 to 315. In order to assemble the output signals from the flip-flop circuits into three-signal groups in the present embodiment, the signal group (a) is composed of the output signal from the D flip-flop circuit 100 and the output signal from the JK flip-flop circuit 101 and 102 as shown in FIG. 3. In the same manner, the signal groups (b) to (e) are composed of the output signals from the JK flip-flop circuits 103 to 105, 106 to 108, 109 to 111, and 112 to 114.

As mentioned above, in this second embodiment, lower-stage signal assembling circuits 311 to 315 for producing logical product signals of the count signals in these signal groups, and upper-stage signal assembling circuits 411 to 413 for further assembling the output signals from those lower-stage assembled-signal handling circuits are provided, with the output count signals from the flip-flop circuits being assembled in three-signal units. As a result, the signal time delays which would otherwise be accumulated by the inversion operations of the flip-flop circuits and AND circuits operationally included in the signal groups are reduced.

Accordingly, in this embodiment, since a method of providing common wire lines and causing the relevant signals to be inputted to the relevant circuits is not employed, it is possible to simultaneously realize high-speed operation and wiring pattern simplification/circuit-area reduction. In addition, the number of elements employed is not exponentially increased even when the number of the relevant bits is increased, unlike conventional circuits.

Further, in this embodiment, since the number of serial connections between AND circuits is decreased over that of the synchronous counter according to the first embodiment, it is possible to further reduce accumulation of signal time delays over the first embodiment. Since the time delay of the count signal Q0 can be sufficiently shortened as mentioned above, misoperations do not occur even when the frequency of the clock signal CK is increased over the prior art, enabling higher-speed performance of the counting operation.

Additionally, the number of the whole bits used in the counter circuit is not limited to the 16 bits shown in the embodiment (Q0 to Q15) but may be further increased to a higher multi-bit arrangement. Namely, if such an arrangement is desired, it is permissible to assemble the count signals from the relevant circuits into count-signal groups in two-bit or three-bit units, add lower-stage signal assembling circuits for producing logical product signals of the count signals from the JK flip-flop circuits operationally included in those count-signal groups, and further add upper-stage signal assembling circuits for producing logical product signals of the output signals from the signal assembling circuits that are operationally included in the count-signal groups that precede such count-signal groups. While the count signals from the relevant flip-flop circuits are transmitted to upper-order bit elements by being blocked or assembled in two-bit units in the first embodiment and in three-bit units in the second embodiment, four or more bit signals may be assembled and transmitted to upper-order bit elements and, in addition, the number of the count signals may be different for each count-signal group. However, in cases where the number of count signals to be blocked by the count-signal groups is too large, the number of the input signals to each signal assembling circuit for assembling the count signals in the relevant count-signal group increases, with the result that time delays in the signal assembling circuit increase. Furthermore, in such a case, the circuit structure also becomes complicated, which is accompanied by reduction in the degree of freedom of the circuit pattern. For this reason, the number of the count signals assembled in each count-signal group is preferably 2 or 3.

(Third Embodiment)

The synchronous counter according to a third embodiment of the present invention will hereunder be described with reference to the drawings.

Figure 4:
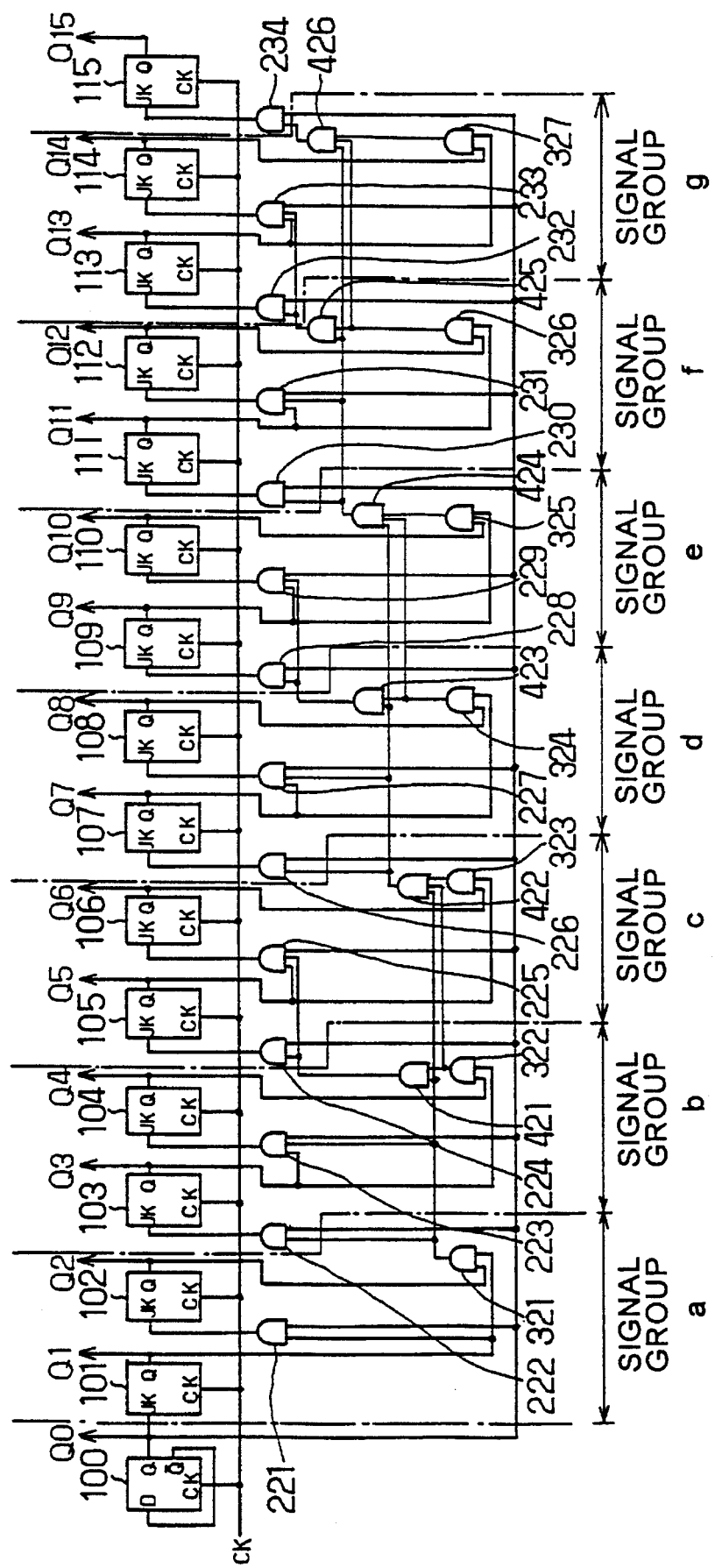
FIG. 4 is a circuit diagram showing a synchronous counter according to a third embodiment of the present invention.

FIG. 4 shows a counter circuit according to the third embodiment of the present invention. In FIG. 4, the counter circuit schematically comprises a single D flip-flop circuit 100 for performing divide-by-2 frequency division on the clock signal CK, JK flip-flop circuits 101 to 115 (corresponding to flip-flop circuits) for inverting the levels of the output signals therefrom in synchronization with the clock signal CK when the input signals thereto are in a HIGH state (logical value 1), logic circuits 221 to 234 (corresponding to control signal outputting circuits) for inputting the control signals to the JK flip-flop circuits 102 to 115, lower-stage signal assembling circuits 321 to 327 (corresponding to signal assembling circuits; among which, two adjacent lower-stage signal assembling circuits correspond to first and second signal assembling circuits) for producing logical product signals of the signals in the signal groups prepared by assembling the output signals from the JK flip-flop circuits 101 to 114 in two-signal units, and upper-stage signal assembling circuits 421 to 426 (corresponding to third signal assembling circuits) for further assembling the output signals from the lower-stage signal assembling circuits 321 to 327.

In this third embodiment, since the count signals are assembled in two-count-signal units into the count-signal groups, the signal group (a) is composed of the output signal from the JK flip-flop circuit 101 and the output signal from the JK flip-flop circuit 102, as shown in FIG. 4. Similarly, the signal groups (b) to (g) are respectively composed of the output signals from the JK flip-flop 103–104, 105–106, 107–108, 109–110, 111–112, and 113–114.

Note that the output signal Q from the D flip-flop circuit 100 is outputted as the count signal Q0 from the least significant bit, namely the (0)th bit element and, similarly, the output signal Q from the flip-flop circuits 101 to 115 are outputted as the count signals Q1, Q2, ... Q15 from the (1)th and succeeding bit elements. In this third embodiment, an arithmetic operation circuit is composed of the D flip-flop circuit 100 and JK flip-flop circuits 101 to 115.

The functions of the constituent elements involved will now be briefly described. First, the first JK flip-flop circuit 101 is supplied with the count signal Q0 from the D flip-flop circuit 100 as a JK input signal.

In the signal group (a), the logic circuit 221 is a single AND circuit to which the count signal Q0 from the D flip-flop circuit 100 and the count signal Q1 from the JK flip-flop circuit 101 are supplied in parallel, the AND circuit forming a control signal with respect to the JK flip-flop circuit 102. Also, the lower-stage signal assembling circuit 321 is a single AND circuit to which the count signal Q1 from the JK flip-flop circuit 101 and the count signal Q2 from the JK flip-flop circuit 102 are supplied in parallel, the AND circuit corresponding to the signal assembling circuit for the signal group (a).

In the signal group (b), the logic circuit 222 is a single AND circuit to which the count signal Q0 from the binary counter 100 and the output signal from the lower-stage signal assembling circuit 321 are supplied in parallel, the AND circuit forming a control signal with respect to the JK flip-flop circuit 103. The logic circuit 223 is a single AND circuit to which the count signal Q0 from the D flip-flop circuit 100, the output signal Q2 from the lower-stage signal assembling circuit 321, and the count signal Q3 from the JK flip-flop circuit 103 are supplied in parallel, the AND circuit forming a control signal with respect to the JK flip-flop circuit 104. The lower-stage signal assembling circuit 322 is a single AND circuit to which the count signal Q3 from the flip-flop circuit 103 and the count signal Q4 from the JK flip-flop circuit 104 are supplied in parallel, this circuit corresponding to the signal assembling circuit for the signal group (b). Further, the upper-stage signal assembling circuit 421 (which corresponds to a third signal assembling circuit) is a single AND circuit for producing a logical product signal of the output signal from the lower-stage signal assembling circuit 321 which is the signal assembling circuit for the signal group (a) and the output signal from the lower-stage signal assembling circuit 322 which is the signal assembling circuit for the signal group (b).

Thereafter, similarly, the lower-stage signal assembling circuits 323, 324, 325, 326, and 327 are single AND circuits to which the count signals from the flip-flop circuits 105–106, 107–108, 109–110, 111–112, and 113–114, and the lower-stage signal assembling circuits corresponding to the signal assembling circuits for the signal groups (c), (d), (e), (f), and (g), are respectively supplied in parallel. The upper-stage signal assembling circuit 422 is a single AND circuit for producing a logical product signal of the output signals from the lower-stage signal assembling circuits for the signal groups (a) to (c), the upper-stage signal assembling circuit 423 is a single AND circuit for producing a logical product signal of the output signal from the upper-stage signal assembling circuit 422 and the output signal from the lower-stage signal assembling circuit 324 for the signal group (d), the upper-stage signal assembling circuit 424 is a single AND circuit for producing a logical product signal of the output signal from the upper-stage signal assembling circuit 422 and the output signals from the lower-stage signal assembling circuits 324 and 325 for the signal groups (d) and (e), the upper-stage signal assembling circuit 425 is a single AND circuit for producing a logical product signal of the output signal from the upper-stage signal assembling circuit 424 and the output signal from the lower-stage signal assembling circuit 326 for the signal group (f), and the upper-stage signal assembling circuit 426 is a single AND circuit for producing a logical product signal of the output signal from the upper-stage signal assembling circuit 424 and the output signals from the lower-stage signal assembling circuits 326 and 327 for the signal groups (f) and (g).

The logic circuits 224, 226, 228, 230, 232, and 234 are single AND circuits, to which the output signal from the upper-stage signal assembling circuit 421 and the count signal Q0 from the D flip-flop circuit 100 are supplied in parallel, the output signal from the upper-stage signal assembling circuit 422 and the count signal Q0, the output signal from the upper-stage signal assembling circuit 423 and the count signal Q0, the output signal from the upper-stage signal assembling circuit 424 and the count signal Q0, the output signal from the upper-stage signal assembling circuit 425 and the count signal Q0, and the output signal from the upper-stage signal assembling circuit 426 and the count signal Q0, respectively, the AND circuits forming control signals with respect to the JK flip-flop circuits 105, 107, 109, 111, 113, and 115, respectively. Further, the logic circuits 225, 227, 229, 231, and 233 are pieces of AND circuits, respectively, to which there are parallel supplied the output signal from the upper-stage signal assembling circuit 421 and the count signal Q0 from the D flip-flop circuit 100 and the count signal Q5 from the JK flip-flop circuit 105, the output signal from the upper-stage signal assembling circuit 422 and the count signal Q0 and the count signal Q7, the output signal from the upper-stage signal assembling circuit 423 and the count signal Q0 and the count signal Q9, the output signal from the upper-stage signal assembling circuit 424 and the count signal Q0 and the count signal Q11, and the output signal from the upper-stage signal assembling circuit 425 and the count signal Q0 and the count signal Q13, the AND circuits forming control signals with respect to the JK flip-flop circuits 106, 108, 110, 112, and 114, respectively.

Next, the operation of the above-constructed synchronous counter will now be described hereunder with use of the time chart shown in FIG. 5. In this description, however, the number of the count signals is limited to 8 of from the Q0 to the Q7 count signal and a relevant explanation will be given as to a case wherein the counter exhibits its greatest variation, namely a case wherein each of all the bits exhibits its change.

Figure 5:
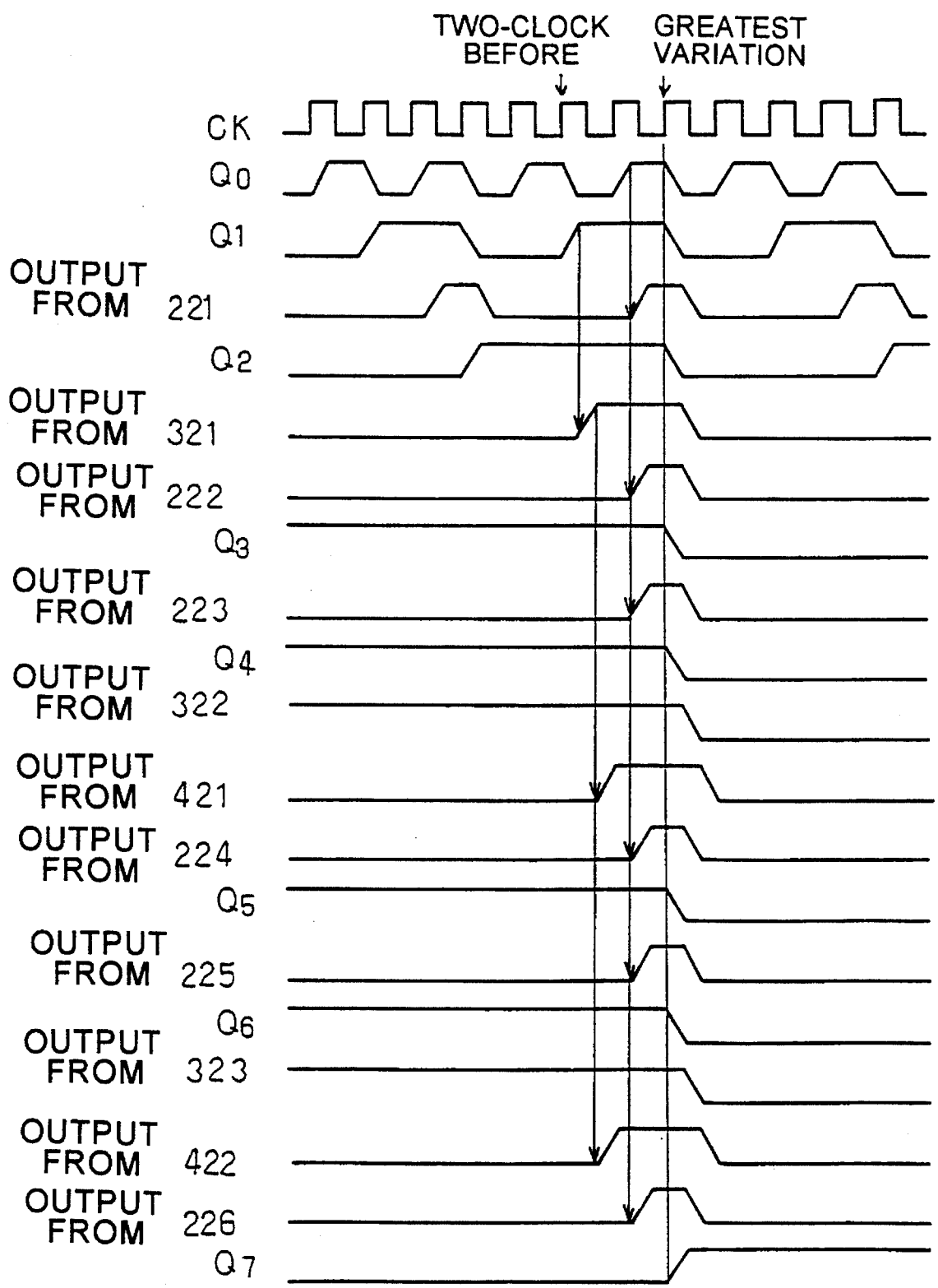
FIG. 5 is a time chart showing the signal operation of the synchronous counter shown in FIG. 4.

The timing at which in FIG. 5 the count signal Q7 that corresponds to the upper-order bit element varies is the timing at which the clock signal CK has changed from its LOW state to its HIGH state during a time period in which all the count signals Q0 to Q6 are in their HIGH state.

Considering now a clock-signal state (in which the count signal Q1 is in its LOW state and all others Q0 and Q2 to Q6 are in their HIGH state) that precedes by two clock-signal pulses to the clock-signal state in which all the count signals Q0 to Q6 are in their HIGH state. The output signals from the relevant elements are such that the output signal from the lower-stage signal assembling circuit 322 and the output signal from the lower-stage signal assembling circuit 323 are in a HIGH state, and the output signals from the remaining circuits are all in a LOW state.

When the clock signal CK changes from its LOW state to its HIGH state, the count signal Q0 decreases in level to its LOW state while, on the other hand, the count signal Q1 increases in level to its HIGH state. Since, therefore, the input signals to the lower-stage signal assembling circuit 321 both have their HIGH level, the output signal therefrom has its HIGH level. In addition, the input signals to the upper-stage signal assembling circuits 421 and 422 all have their HIGH level, so that the output signals therefrom both have their HIGH level.

Next, when the clock signal CK changes from its LOW state to its HIGH state, the count signal Q0 increases in level to its HIGH state. Namely, since both the count signals Q0 and Q1 have their HIGH level, the output signal from the logic circuit 221 has its HIGH level. Thereafter, similarly, the output signals from all other logic circuits and the output signals from the upper-stage and lower-stage signal assembling circuits have their HIGH level.

As mentioned above, in the counter of this embodiment, the count signals outputted from the flip-flop circuits are assembled in two-signal units into signal groups, and there are provided the lower-stage signal assembling circuits 321 to 327 for producing logical product signals of the count signals in the signal groups and the upper-stage signal assembling circuits 421 to 426 for further assembling the output signals from those lower-stage signal assembling circuits 321 to 327. As a result of this, the signal time delays which would otherwise be accumulated by the inversion operations of the flip-flop circuits and AND circuits operationally included in the signal groups are decreased. A higher-speed operation can be realized by providing common wire lines and causing the count signal from the (0)th flip-flop circuit that is most frequently inverted to be commonly inputted.

Further, as regards the number of the elements employed as well, this number does not exponentially increase even when the number of relevant bits is increased, unlike the conventional circuits. Further, in this embodiment, since the time delay of the count signal Q0 can be sufficiently shortened, no erroneous operation occurs even when the frequency of the clock signal CK is increased more than in the case of the conventional circuits. This makes it possible to perform the counting operation with a higher speed.

It is to be noted that the number of the whole bits of the counter circuit is not limited to 16 bits (Q0 to Q15) shown in this embodiment, but may be more increased to a more multi-bit arrangement. Specifically, the relevant signals are grouped in two-bit or three-bit units into signal groups, and lower-stage signal assembling circuits for producing logical product signals from the JK flip-flop circuits operationally included in the signal groups may be added and further upper-stage signal assembling circuits for producing logical product signals of the output signals from the signal assembling circuits operationally included in the preceding signal groups may be added, whereby a more multi-bit arrangement can be realized. While in the third embodiment the relevant signals are groped in two-signal units into signal groups and transmitted to upper-order bit element, three or more bit signals may be arranged to be transmitted to upper-order bit elements. Further, the number of the count signals may be different for each signal group. However, in cases where the number of the count signals grouped by each signal group is too great, the number of the input signals to each signal assembling circuit becomes great with the result that the signal time delay in each such signal assembling circuit increases. In addition, the circuit structure also becomes complicated, which results in that the freedom degree for the circuit pattern disadvantageously decreases. For this reason, the number of the count signals to be handled by each signal group preferably is 2 or 3.

(Fourth Embodiment)

The synchronous counter according to a fourth embodiment of the present invention will hereunder be described along with the drawings.

Figure 6:
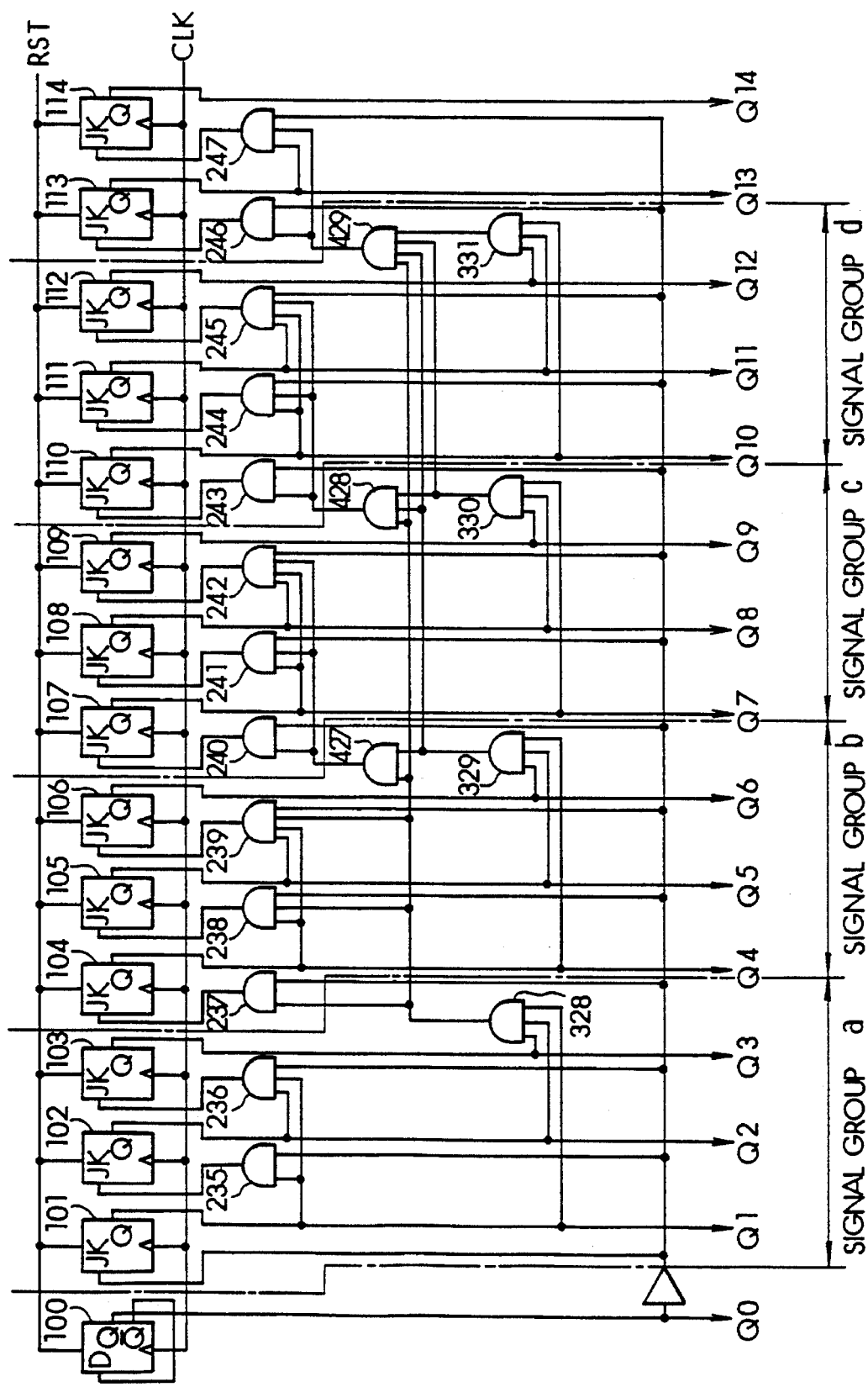
FIG. 6 is a circuit diagram showing a synchronous counter according to a fourth embodiment of the present invention.

FIG. 6 shows a counter circuit according to the fourth embodiment of the present invention. In FIG. 6, the respect that this embodiment counter circuit differs from the third-embodiment counter circuit is that the count signals from the JK flip-flop circuits are group assembled in three-signal units to provide signal groups.

The counter circuit schematically comprises a single D flip-flop circuit 100 for performing divide-by-2 frequency division on the clock signal CK, JK flip-flop circuits 101 to 114 (which correspond to the flip-flop circuits) for inverting the levels of the output signals therefrom in synchronization with the clock signal CK when the input signals thereto are in a HIGH state (logical value 1), logic circuits 235 to 247 for inputting the control signals to the JK flip-flop circuits 102 to 114, lower-stage signal assembling circuits 328 to 331 which correspond to the signal assembling circuits. Among these, two adjacent logic circuits correspond to first and second signal assembling circuits) for producing logical product signals of the signals in the signal groups prepared by grouping the output signals from the JK flip-flop circuits 101 to 114 in three-signal units, and upper-stage signal assembling circuits 427 to 429 (which correspond to third signal assembling circuits) for further assembling the output signals from the lower-stage signal assembling circuits 328 to 331. In this fourth embodiment, since the count signals are grouped in three-count-signal units into the count-signal groups, the signal group (a) is composed of the output signals from the JK flip-flop circuits 101 to 103, as shown in FIG. 6. Similarly, the signal groups (b) to (d) are composed of the output signals from the JK flip-flop 104–106, 107–109, and 110–112.

Note that the output signal Q from the D flip-flop circuit 100 is outputted as the count signal Q0 from the least significant bit, namely the (0)th bit element and, similarly, the output signals Q from the (1)th and its succeeding flip-flop circuits 101 to 114 are outputted as the count signals Q1, Q2, ... Q14.

As mentioned above, in the counter of this embodiment, the count signals outputted from the flip-flop circuits are grouped in three-signal units into signal groups, and there are provided the lower-stage signal assembling circuits 328 to 331 for producing logical product signals of the count signals in the signal groups and the upper-stage signal assembling circuits 427 to 429 for further assembling the output signals from those lower-stage signal assembling circuits 328 to 331. As a result of this, the signal time delays which would otherwise be accumulated by the inversion operations of the flip-flop circuits and AND circuits operationally included in the signal groups are decreased. A higher-speed operation can be realized by providing common wire lines and causing the count signal from the (0)th flip-flop circuit that is most frequently inverted to be commonly inputted.

Further, as regards the number of the elements employed, this number does not exponentially increase even when the number of relevant bits is increased, unlike conventional circuits.

Further, in this embodiment, since the number of serial connections of the AND circuits is further reduced over that in the synchronous counter according to the third embodiment, it is possible to further reduce accumulation of the signal time delays over the third embodiment. Since the time delay of the count signal Q0 can be sufficiently shortened as mentioned above, no erroneous operation occurs even when the frequency of the clock signal CK is made higher than in the prior art, enabling the performance of the counting operation with a higher speed.

(Fifth Embodiment)

The synchronous counter according to a fifth embodiment of the present invention will hereunder be described along with the drawings.

Figure 7:
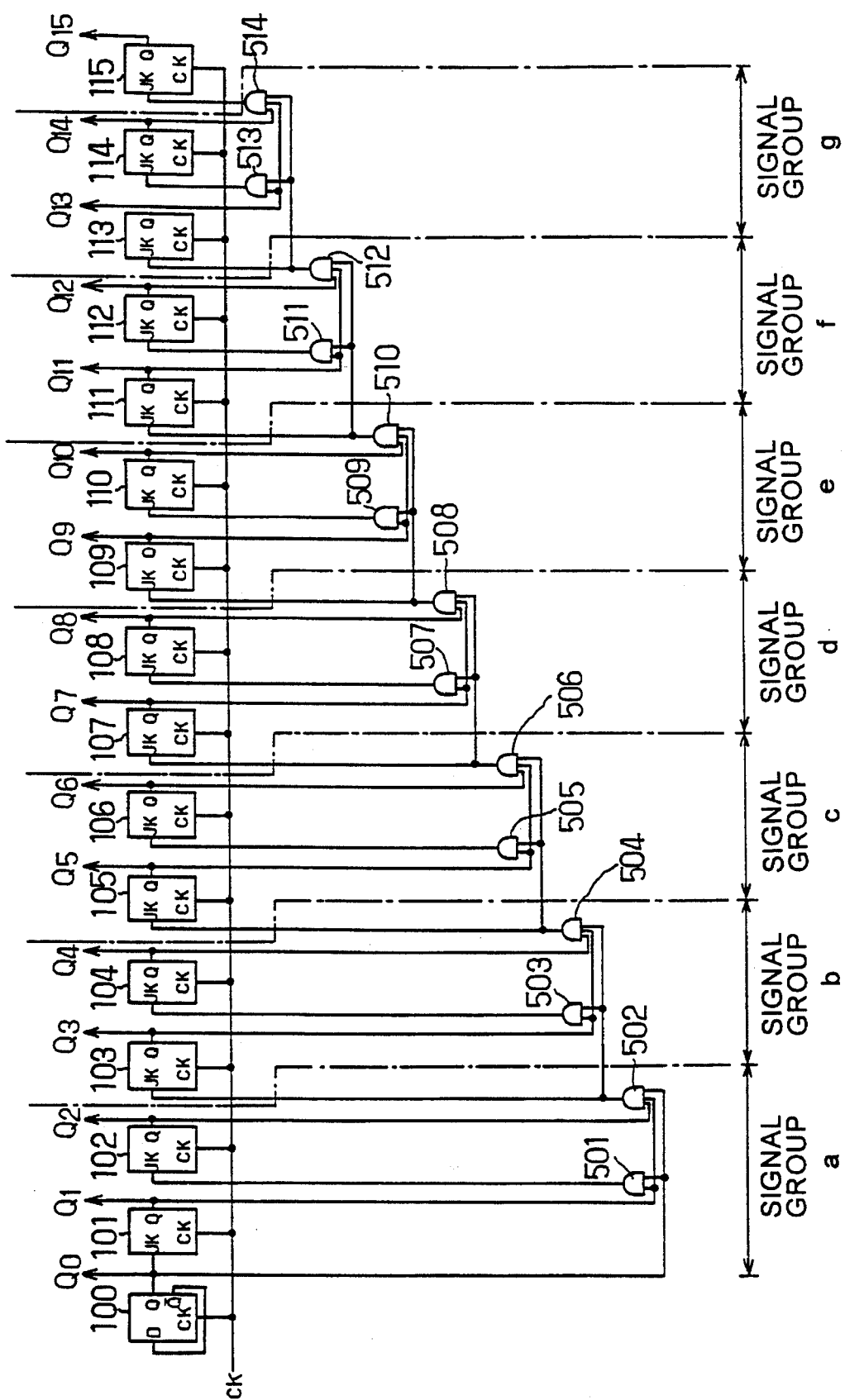
FIG. 7 is a circuit diagram showing a synchronous counter according to a fifth embodiment of the present invention.

FIG. 7 shows a counter circuit according to the fifth embodiment of the present invention. In FIG. 7, the counter circuit schematically comprises a single D flip-flop circuit 100 for performing divide-by-2 frequency division on the clock signal CK, JK flip-flop circuits 101 to 115 (corresponding to the flip-flop circuits) for inverting the levels of the output signals therefrom in synchronization with the clock signal CK when the input signals thereto are in their HIGH-state (logical value 1), and logic circuits 501 to 514 (which correspond to the control signal outputting circuits) for inputting the control signals to the JK flip-flop circuits 102 to 115. In this fifth embodiment, since the count signals are grouped in two-count-signal units into the count-signal groups, the signal group (a) is composed of the output signal from the D flip-flop circuit 100 and the output signals from the JK flip-flop circuit 101 and JK flip-flop circuit 102, as shown in FIG. 7. Similarly, the signal groups (b) to (g) are respectively composed of the output signals from the JK flip-flop 103–104, 105–106, 107–108, 109–110, 111–112, and 113–114, in that order.

Note that the output signal Q from the D flip-flop circuit 100 is outputted as the count signal Q0 from the least significant bit, namely the (0)th bit element and, similarly, the output signals Q from the flip-flop circuits 101 to 115 are outputted as the count signals Q1, Q2, ... Q15 from the (1)th and its succeeding bit elements. In this embodiment, an arithmetic operation circuit is composed of the D flip-flop circuit 100 and JK flip-flop circuits 101 to 115. Further, the logic circuits 502, 504, 506, 508, 510, 512, and 514 correspond to the signal assembling circuits.

The functions of the constituent elements involved will now be briefly described hereunder. First, the first JK flip-flop circuit 101 has the count signal Q0 from the D flip-flop circuit 100 supplied thereto as a JK input signal.

In the signal group (a), the logic circuit 501 is a single AND circuit to which the count signal Q0 from the D flip-flop circuit 100 and the count signal Q1 from the JK flip-flop circuit 101 are supplied in parallel, the AND circuit forming a control signal with respect to the second JK flip-flop circuit 102. The logic circuit 502 is single of AND circuit to which the count signal Q0 from the D flip-flop circuit 100, the count signal Q1 from the JK flip-flop circuit 101, and the count signal Q2 from the JK flip-flop circuit 102 are supplied in parallel, the AND circuit forming a control signal with respect to the third JK flip-flop circuit 103.

In the signal group (b), the logic circuit 503 is a single AND circuit to which the count signal Q3 from the JK flip-flop circuit 103 and the control signal outputted from the logic circuit 502 are supplied in parallel, the AND circuit forming a control signal with respect to the fourth JK flip-flop circuit 104. The logic circuit 504 is a single AND circuit to which the count signal Q3 from the JK flip-flop circuit 103, the control signal outputted from the logic circuit 502, and the count signal Q4 from the JK flip-flop circuit 104 are parallel supplied, the AND circuit forming a control signal with respect to the fifth JK flip-flop circuit 105.

Thereafter, similarly, in the signal groups (c) to (g), the logic circuits 505, 507, 509, 511, and 513 are single AND circuits, to which the count signal Q5 from the JK flip-flop circuit 105 and the control signal outputted from the logic circuit 504, the count signal Q7 from the JK flip-flop circuit 107 and the control signal outputted from the logic circuit 506, the count signal Q9 from the JK flip-flop circuit 109 and the control signal outputted from the logic circuit 508, the count signal Q11 from the JK flip-flop circuit 111 and the control signal outputted from the logic circuit 510, and the count signal Q13 from the JK flip-flop circuit 113 and the control signal outputted from the logic circuit 512 are respectively supplied, the AND circuits forming the control signals with respect to the JK flip-flop circuits 106, 108, 110, 112, and 114. On the other hand, the logic circuits 506, 508, 510, 512, and 514 are single AND circuits, to which the count signals Q5 and Q6 from the JK flip-flop circuits 105 and 106 and the control signal outputted from the logic circuit 504, the count signals Q7 and Q8 from the JK flip-flop circuits 107 and 108 and the control signal outputted from the logic circuit 506, the count signals Q9 and Q10 from the JK flip-flop circuits 109 and 110 and the control signal outputted from the logic circuit 508, the count signals Q11 and Q12 from the JK flip-flop circuits 111 and 112 and the control signal outputted from the logic circuit 510, and the count signals Q13 and Q14 from the JK flip-flop circuits 113 and 114 and the control signal outputted from the logic circuit 512 are respectively supplied in parallel, the AND circuits forming the control signals with respect to the JK flip-flop circuits 107, 109, 111, 113, and 115, respectively.

Next, the operation of the above-constructed synchronous counter will now be described hereunder with use of the time chart shown in FIG. 8. In this description, however, the number of the count signals is limited to 8 of the Q0 to the Q7 count signals, a relevant explanation being given with regard to a case wherein the counter exhibits its greatest variation, namely a case wherein each of the bits exhibits a change.

Figure 8:
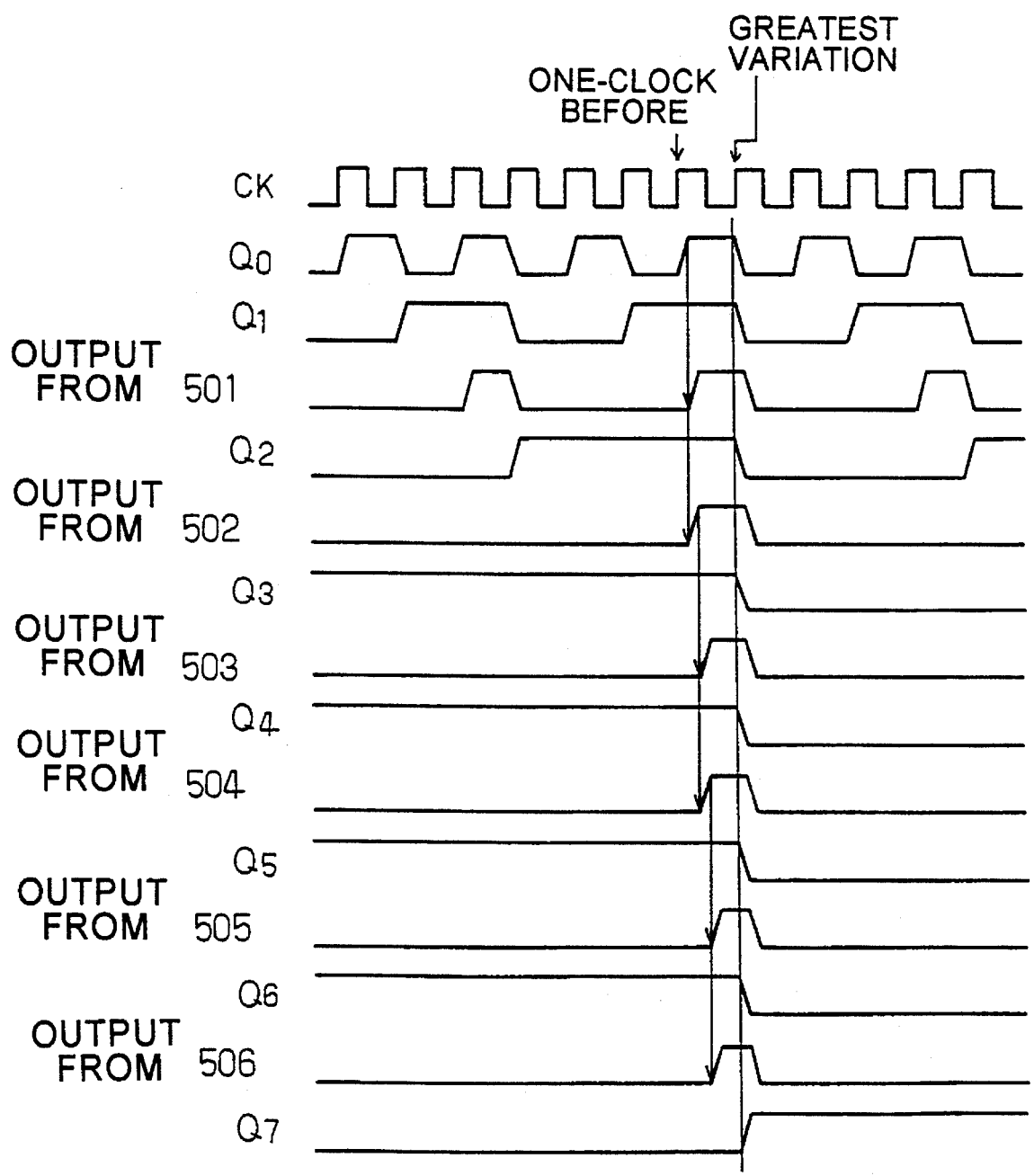
FIG. 8 is a time chart showing the signal operation of the synchronous counter shown in FIG. 7.

The timing at which in FIG. 8 the count signal Q7 that corresponds to the upper-order bit element varies is the timing at which the clock signal CK has changed from its LOW state to its HIGH state during a time period in which all the count signals Q0 to Q6 are in their HIGH state.

Considering now a clock-signal state (in which the count signal Q0 is in a LOW state and all others Q1 to Q6 are in a HIGH state) that precedes by one clock-signal pulses to the clock-signal state in which all the count signals Q0 to Q6 are in a HIGH state.

When the counter circuit is in this state, the control signals are all in a LOW state.

When the clock signal CK changes from its LOW state to a HIGH state, the count signal Q0 increases in level to a HIGH state. Since, therefore, the input signals to the logic circuit 501 are both at a HIGH level, the output signal therefrom is at HIGH level. In addition, the input signals to the logic circuit 502 are all at a HIGH level, so that the output signals therefrom is at HIGH level. As a consequence, since the input signals to the logic circuit 503 are both at a HIGH level, the output signal therefrom is at HIGH level. Further, since the input signals to the logic circuit 504 are all at HIGH level, the output signal therefrom is at HIGH level. Thereafter, similarly, the output signals from the logic circuits 505 and 506 are at HIGH level because the input signals thereto are all at HIGH level. In this manner, the output signals from the relevant logic circuits increase in level to HIGH level while being sequentially delayed from the lower-order bit side.

As mentioned above, in the counter of this embodiment, since the count signals within the counter are grouped into signal groups and there are provided in units of these signal groups the control signal outputting circuits (signal assembling circuits) for producing logical product signals of the count signals in those signal groups after having these signals inputted in parallel thereto, the signal time delays which would otherwise be accumulated gradually by the inversion operations of the logic circuits operationally included in the signal groups are decreased by sequentially transmitting the above-mentioned group processed logical product signals to the upper-order bit elements. For this reason, the time delays of the count signals Q0 can be sufficiently shortened. Namely, since in this embodiment no technique of providing common wire lines and causing the relevant signals to be inputted to their corresponding bit elements is employed, both the achievement of the high-speed operation and the wiring-pattern simplification/circuit-area reduction can simultaneously be satisfied. Regarding the number of the elements used as well, this number does not exponentially increase even when the number of bits increases, unlike the conventional circuits. Accordingly, no erroneous operation occurs even when the frequency of the clock signal CK is increased more than in the prior art, and thus a higher-speed operation can be performed.

Figure 9:
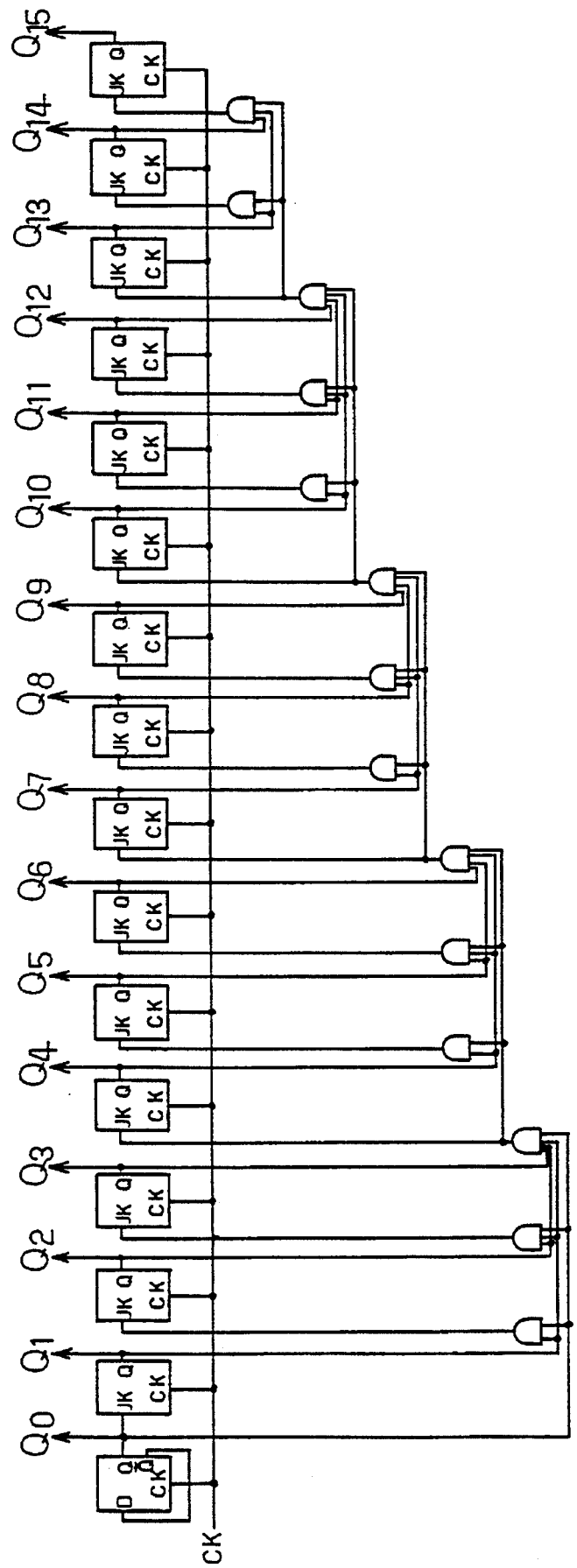
FIG. 9 is a circuit diagram showing a synchronous counter according to an embodiment of the present invention.

Note that while in this embodiment the carrying logic circuits are serially connected in two-bit units, if the required counter speed and circuit area can be satisfied, the logic circuits may be also provided in three or more bit units. FIG. 9 shows an example wherein this embodiment is applied to a case where the logic circuits are provided in three-bit units. Since when as shown the logic circuits are grouped in n-bit units, the logic circuits having an (n+1) number of input terminals are necessary, it is preferred to determine the value of n in connection with the required clock speed and the permissible circuit area. Further, the value of n does not need to be fixed throughout the circuit, namely the logic circuits do not need to be combined periodically, but different numbers of grouped logic circuits may be arbitrarily combined as the occasion demands. Further, the number of the whole bits used in the counter circuit is not limited to 16 bits (Q0 to Q15) shown in the embodiment, but may be more increased to a more multi-bit arrangement.

Figure 10:
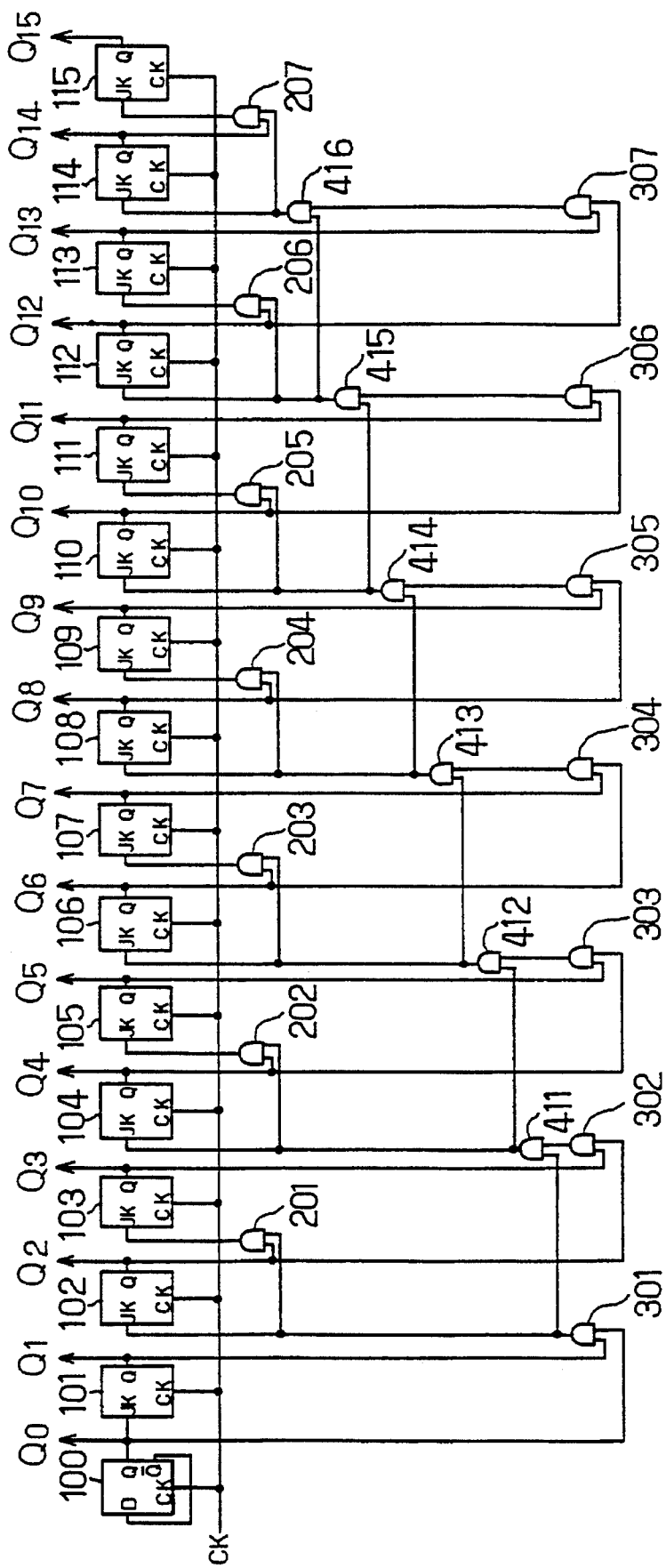
FIG. 10 is a circuit diagram showing a synchronous counter according to an embodiment of the present invention.
Figure 11:
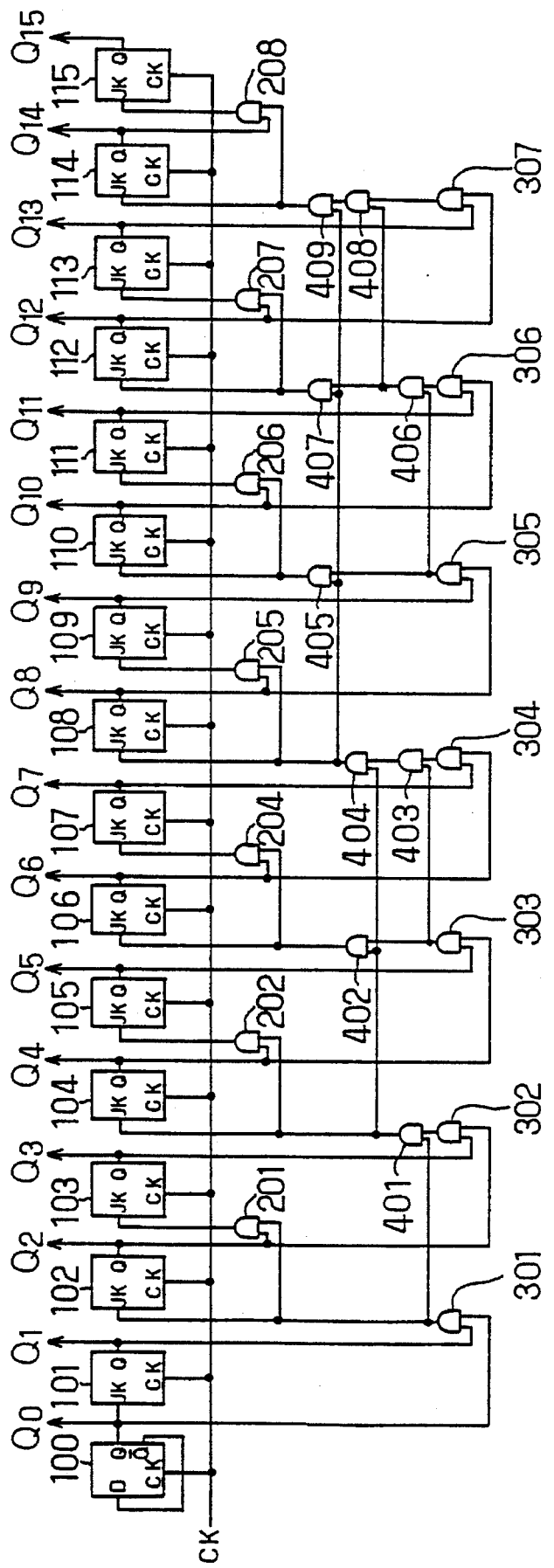
FIG. 11 is a circuit diagram showing a synchronous counter according to an embodiment of the present invention.

Additionally, in the above-mentioned first embodiment, the upper-stage signal assembling circuits 401 to 406 are not limited to the arrangement shown in FIG. 1, but may be arranged as shown in, for example, FIGS. 10 and 11. Namely, the signal assembling circuits may be arranged in such a manner that the output signals from the lower-stage signal assembling circuits 301 to 307 for collectively handling the count signals in each signal group are further collectively handled.

Figure 12:
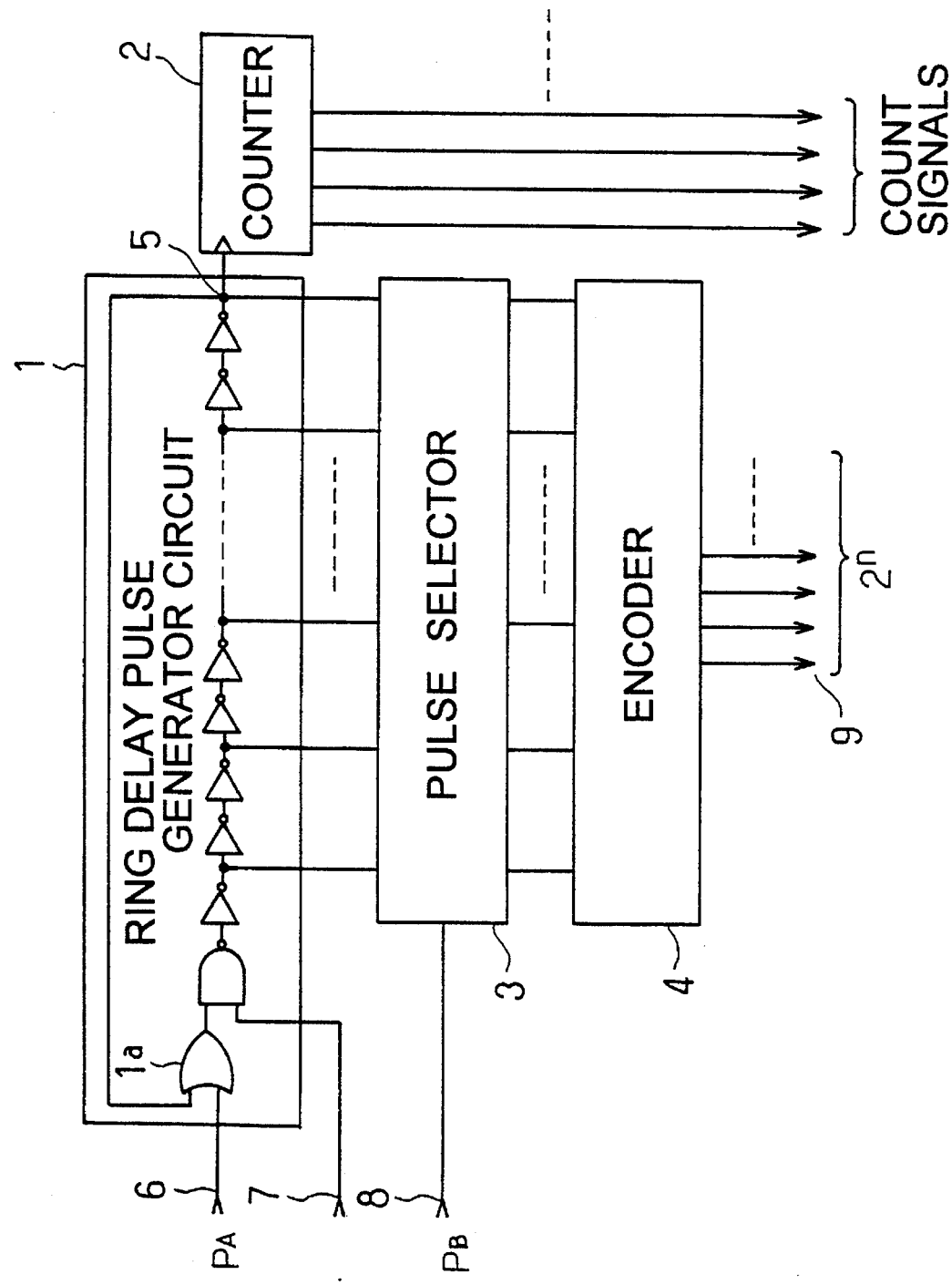
FIG. 12 is a circuit diagram of the synchronous counter of the present invention applied to a time to digital conversion circuit.
Figure 13:
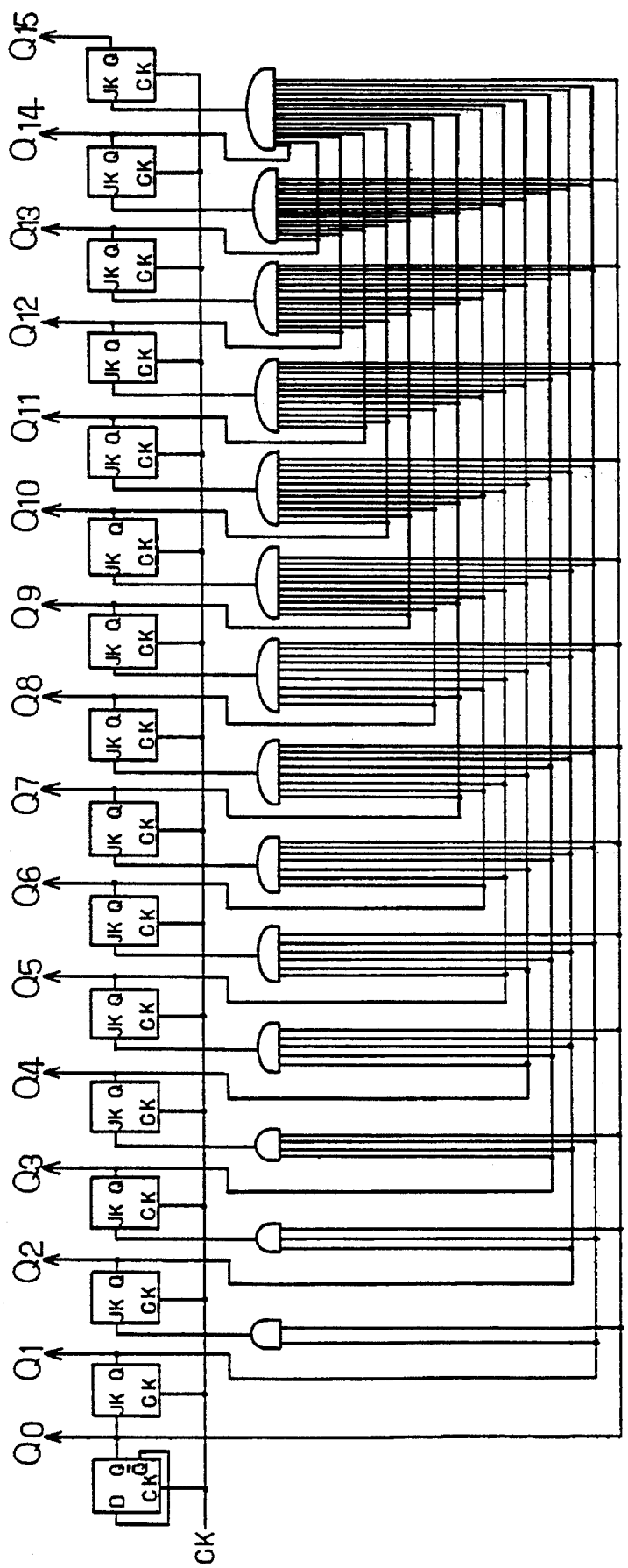
FIG. 13 is a circuit diagram showing a conventional synchronous counter.
Figure 14:
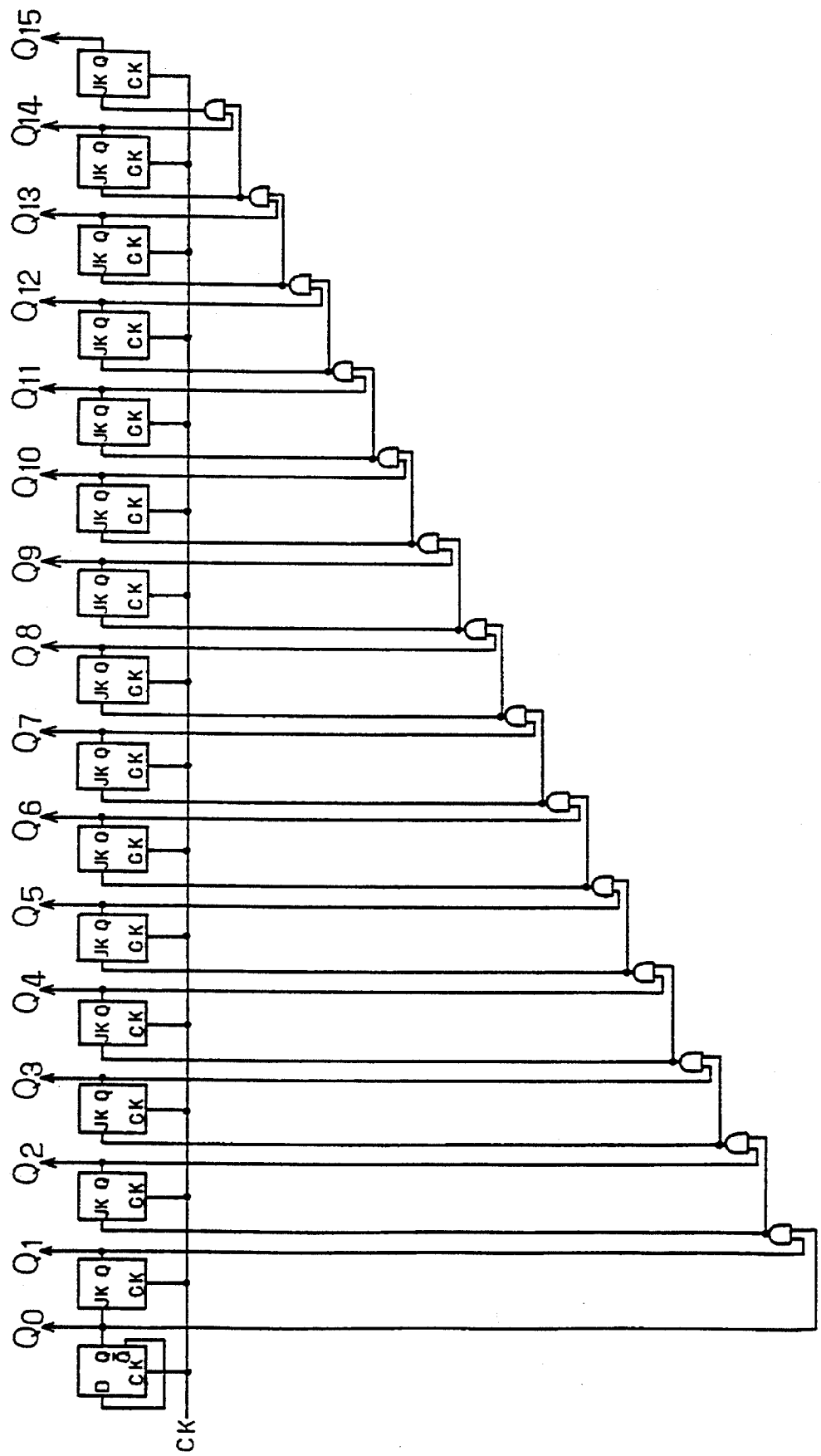
FIG. 14 is a circuit diagram showing a conventional synchronous counter.
Figure 15:
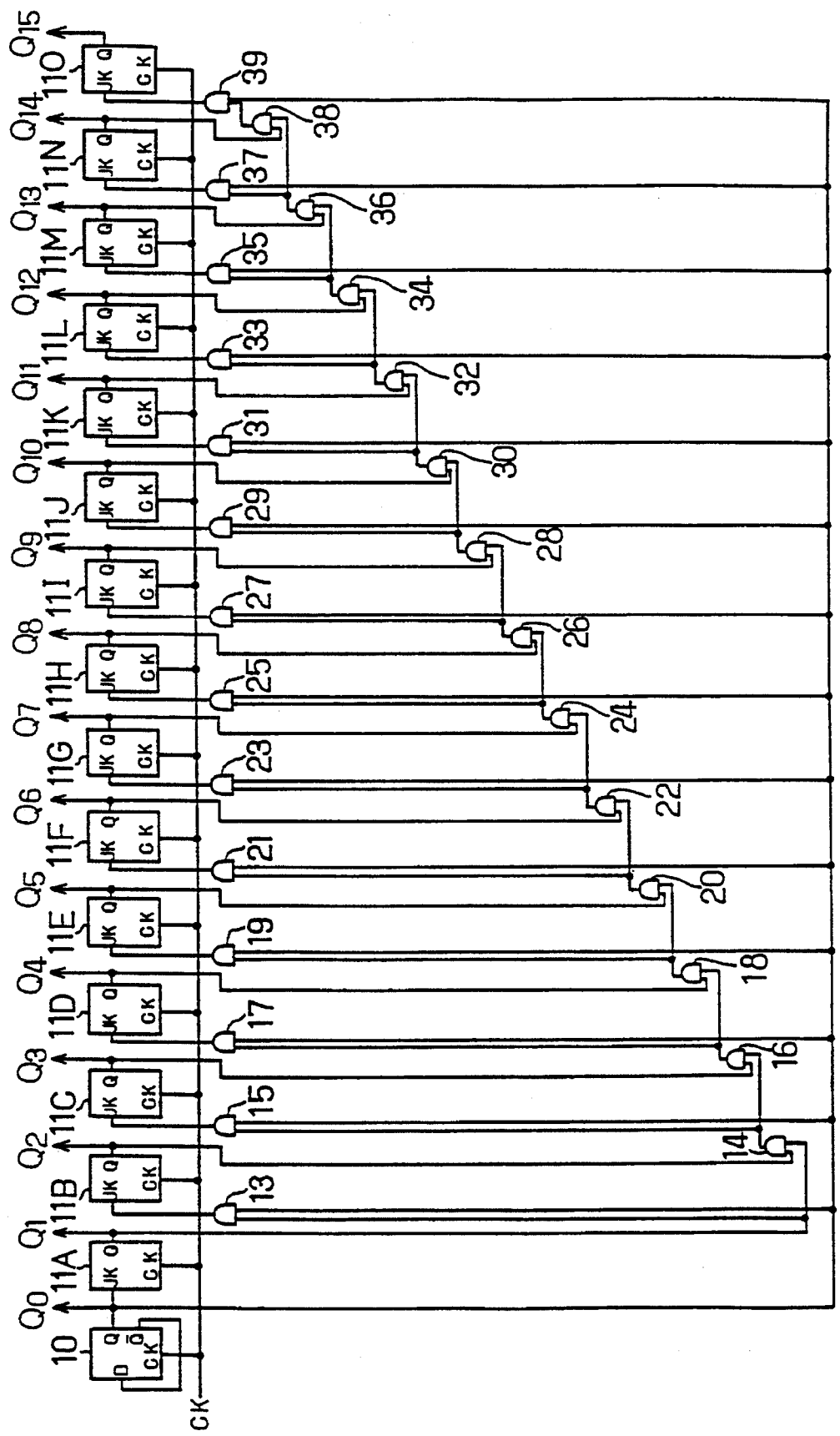
FIG. 15 is a circuit diagram showing a conventional synchronous counter.
Figure 16:
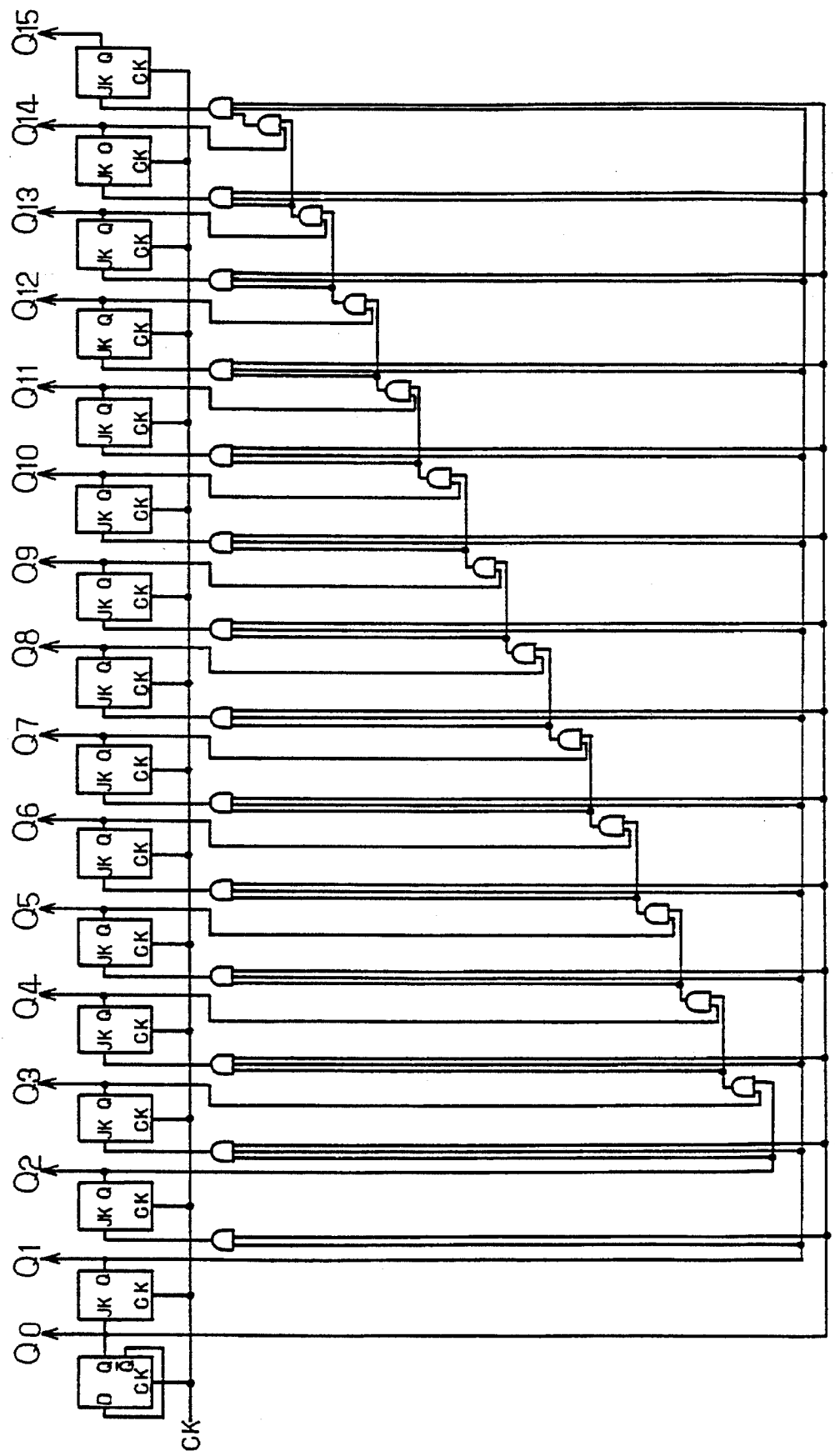
FIG. 16 is a circuit diagram showing a conventional synchronous counter.
Figure 17:
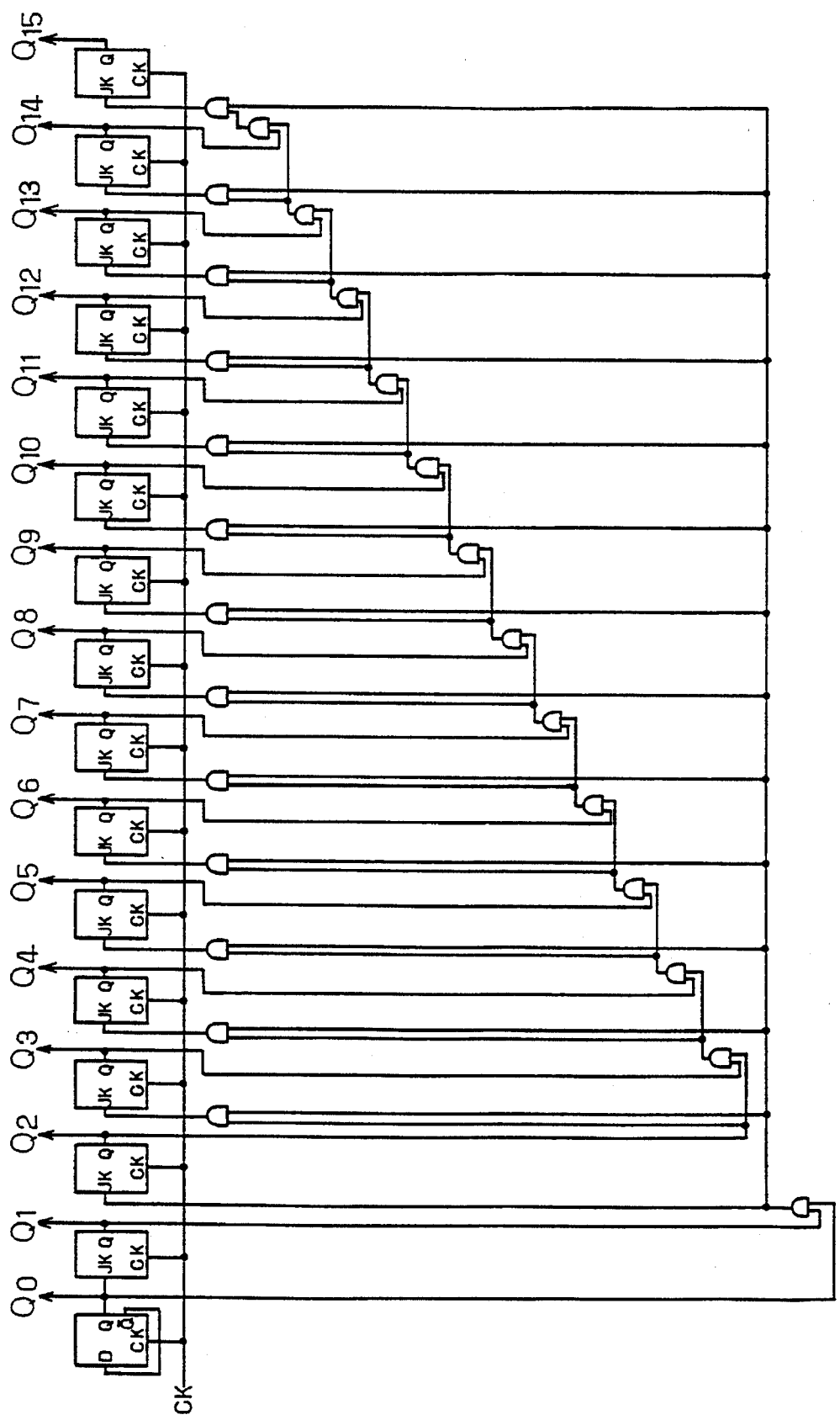
FIG. 17 is a circuit diagram showing a conventional synchronous counter.
Figure 18:
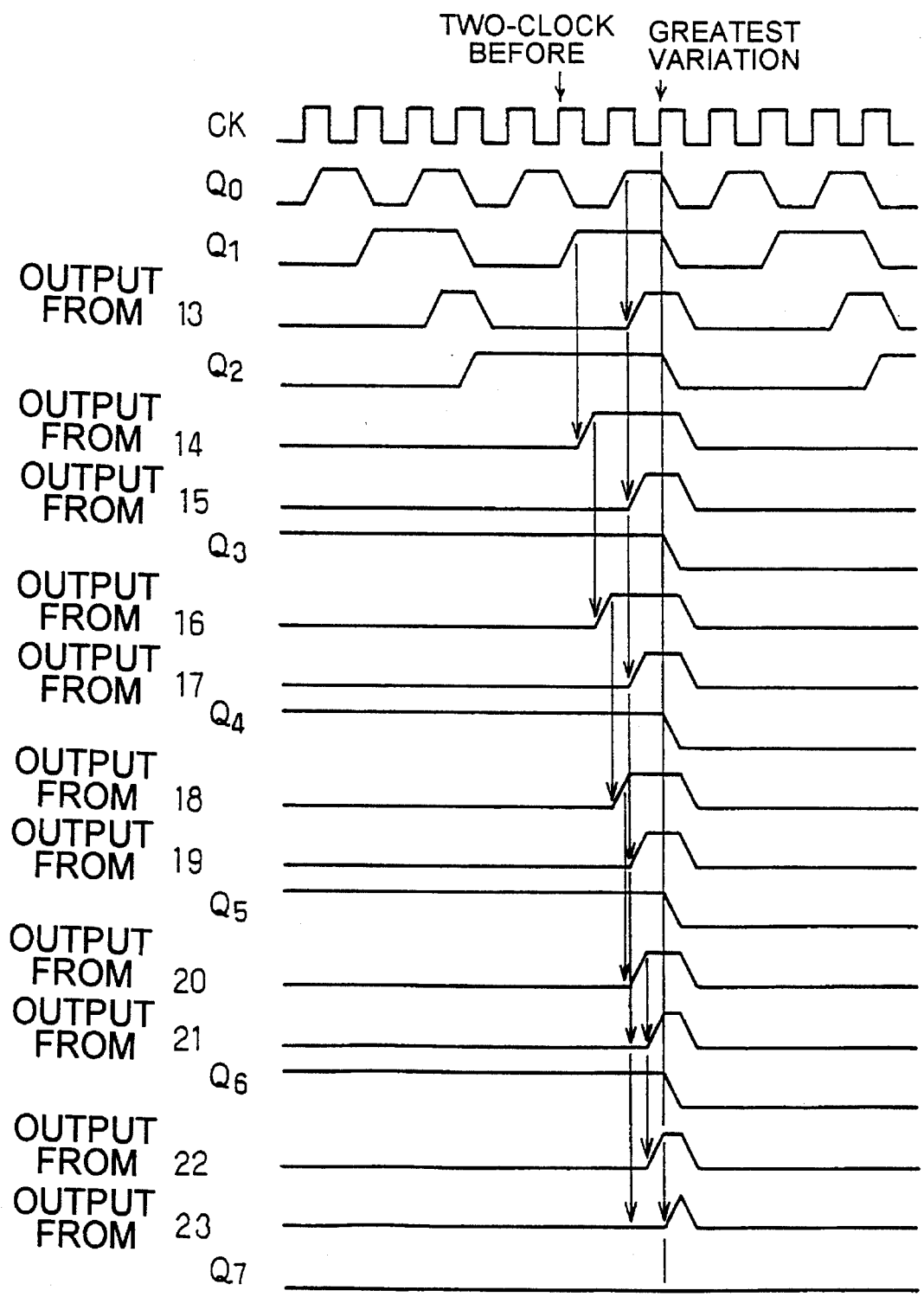
FIG. 18 is a time chart showing the signal operation of the conventional synchronous counter shown in FIG. 15.

The synchronous counter of the present invention shown in the first to the fifth embodiment is used, for example, in a time to digital conversion circuit shown in FIG. 12, or the like. The time to digital conversion circuit is a circuit in which the time difference between two pulses is obtained in the form of an output digital signal.

The time to digital conversion circuit will now be described hereunder with reference to FIG. 12. In FIG. 12, first, a pulse PA is inputted to a ring delay pulse generator circuit in which a plurality of delay elements are connected in series and a final output stage element is so connected that an output therefrom is fed back to a first delay element, whereby the pulse PA is circulated therethrough. Since the outputs of the delay elements composing the ring delay pulse generator circuit are represented by 2-bit binary numbers, the number of the delay elements is the (n)th power of 2. In order to know at what position of this ring delay pulse generator circuit the pulse PA is currently located, the output signals from the delay elements thereof are inputted to a pulse selector. Further, the output signal from a final output stage element of the ring delay pulse generator circuit is inputted to a circulation-frequency counter for counting how many times the pulse PA has circulated through this ring circuit.

When a pulse PB has been inputted, the pulse selector outputs its input signal that has been outputted from the delay element at that time point, to an encoder. The signal that has been converted by the encoder into a binary signal becomes a lower-order bit signal representing the phase difference between the pulses PA and PB. As regards the value of the circulation-frequency counter as well, the signal that corresponds to the timing when the pulse PB has been inputted is outputted by a data latch circuit and thus becomes an upper-order bit signal representing the phase difference between the pulses PA and PB. By giving the above-mentioned construction, the operation becomes equivalent to that which is performed when the delay elements are serially connected in large number.

When it is desired to widen the measurable range of the above-mentioned time to digital conversion circuit, it suffices to increase the number of the output bit signals thereof. This method can be easily realized by increasing the number of the bits used in the circulation-frequency counter. Further, reduction in the circuit area can be realized by reducing the number of the delay elements in the ring delay pulse generator circuit. This is because the size of the pulse selector and encoder is determined by the number of the delay elements therein. For this reason, when the number of the delay elements in the ring delay pulse generator circuit is halved, the size of each of the ring delay pulse generator circuit, pulse selector, and encoder is also halved (that the number of the delay elements is halved means that the outputs of the circuit decrease by one bit). Therefore, even if the circuit area increases by one-bit increase of the circulation-frequency circuit, the circuit area as a whole would become smaller if the circuit area were reduced by halving the number of the delay elements in the ring delay pulse generator circuit. However, the problem that will arise in this connection is that if the number of the delay elements in the ring delay pulse generator circuit is halved, the period of the clock pulse signal supplied to the circulation-frequency is also halved.

For the above-mentioned reasons, although in cases where it is intended to miniaturize the time to digital conversion circuit by use of a multi-bit arrangement, it is indispensable to use a counter operating even when the period of the clock pulse signal is short, the use of the synchronous counter according to the present invention would solve such a problem.

Additionally, although in the above-mentioned first to fifth embodiments the explanation has been given as to application to an up-counter, the invention may be applied to a down-counter. The circuit diagram, in such a case, may be prepared by merely altering the carrying outputs of the D flip-flop circuit and JK flip-flop circuit from Q to Qinv not shown (Qinv represents the inversion output of the Q). Regarding the time chart as well, the count signal levels may be not such that Q0 to Q7 increase from their all 0-levels, but such that Q0 to Q7 decrease from their all 1-level. The signal operation differs in this respect only and the signal operations of the other logic circuits are the same.

Additionally, the present invention is not limited to the circuits shown in the above-mentioned embodiments, but, for example, the logical product signals may be produced with use of NAND circuits or OR circuits or the like. Further, the use purposes thereof may be other use purposes than the time to digital conversion circuit.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A synchronous counter, capable of receiving a clock signal composed of a pulse train supplied thereto, for operating in synchronization with the clock signal, and counting the number of pulses of the pulse train inputted thereto to output an output signal representing a counted value, said counter comprising:

an arithmetic-operation circuit, comprising a plurality of flip-flop circuits corresponding respectively to bit signals from a least significant bit to a most significant bit, for outputting a plurality of count signals outputted from the plurality of flip-flop circuits as output signals representing counted values, each flip-flop circuit of the plurality of flip-flop circuits being arranged to output a count signal corresponding to a control signal corresponding thereto in synchronization with the clock signal when the clock signal and the control signal corresponding thereto having been inputted thereto, each of the control signals inputted to the flip-flop circuits being a logical product signal obtained by the procurement of a logical product of the count signal from the least significant bit flip-flop circuit to the count signal from a flip-flop circuit which immediately precedes the corresponding flip-flop circuit; and a plurality of signal assembling circuits for plurally assembling the plurality of count signals in sequence from the count signal of the least significant bit side flip-flop circuit to the count signal of the most significant bit side flip-flop circuit, to provide a plurality of count-signal grounds, each obtaining a logical product of the count signals in each count signal group of the plurality of count-signal groups to produce an assembling signal, and outputting this assembling signal to a corresponding flip-flop circuit as part of logical product signals composing control signals inputted to the corresponding flip-flop circuits;

wherein the count-signal groups have at least a first count-signal group and a second count-signal group which plurally sequentially handle the count signals from the least significant bit, and a third count-signal group, and each signal assembling circuit further includes a first signal assembling circuit for entering directly and in parallel each count signal in said first count-signal group and for producing an output signal representative of a logical product of the count signals in the first count-signal group;

a second signal assembling circuit for entering directly and in parallel each count signal in said second count-signal group and for producing an output signal representative of a logical product of the count signals in the second count-signal group;

a third signal assembling circuit for entering directly and in parallel each count signal in said third count-signal group and for producing an output signal representative of a logical product of the output signals from the third count-signal group; and a fourth signal assembling circuit for producing an output signal representative of a logical product of the output signals from the first, second and third count-signal groups, for outputting logical product signals as part of the control signals with respect to the flip-flop circuits higher in bit order than any one of the plurality of flip-flop circuits outputting the count signals composing the first, second and third count-signal groups.

2. The synchronous counter according to claim 1, further comprising:

upper-stage signal assembling circuits for producing logical product signals of the output signals from a specified plurality of the signal assembling circuits among the plurality of signal assembling circuits, and for, with respect to the flip-flop circuits higher in bit order than any of the plurality of flip-flop circuits outputting the count signals handled by the specified plurality of signal assembling circuits, outputting the logical product signals as part of the logical product signals composing the control signals inputted to those flip-flop circuits.

3. The synchronous counter according to claim 1, wherein in each of the control signals inputted to the flip-flop circuits composing the arithmetic operation circuit, the count signal from the least significant bit flip-flop circuit among the count signals from the least significant flip-flop circuit to the immediately preceding flip-flop circuit is obtained directly from the count signal from the least significant bit flip-flop circuit.

4. The synchronous counter according to claim 1, wherein the count-signal group is composed of two or three of the count signals.

5. The synchronous counter according to claim 2, wherein the number of the flip-flop circuits composing the arithmetic operation circuit is not less than seven, and the number of serially arranged signal assembling circuits and upper-stage signal assembling circuits from the signal assembling circuit for handling the count signal from the least significant bit flip-flop circuit to the signal assembling circuit for producing the control signal inputted to the most significant bit flip-flop circuit is smaller than half the number of the flip-flop circuits plus 1.

6. A synchronous counter, capable of receiving a clock signal composed of a pulse train supplied thereto, for operating in synchronization with the clock signal, and counting the number of pulses of the pulse train inputted thereto to output an output signal representing a counted value, said counter comprising:

an arithmetic-operation circuit comprising a plurality of flip-flop circuits corresponding respectively to bit signals from a least significant bit to a most significant bit connected in series, flip-flop circuits of the plurality of flip-flop circuits having inputted thereto the clock signal and control signals respectively corresponding to those flip-flop circuits to output the count signals corresponding to the control signals in synchronization with the clock signal, and the control signals corresponding to the flip-flop circuits being signals obtained by procurement of the logical products of the count signals from the count signal outputted from the least significant bit flip-flop circuit to the count signal from the immediately preceding flip-flop circuit; and a plurality of signal assembling circuits for plurally assembling the plurality of count signals in sequence from the count signal of the least significant bit side flip-flop circuit to the count signal of the most significant bit side flip-flop circuit, to provide a plurality of count-signal groups, each obtaining a logical product of the count signals in each count signal group of the plurality of count-signal groups to produce an assembling signal, and outputting this assembling signal to a corresponding flip-flop circuit as part of logical product signals composing control signals inputted to the corresponding flip-flop circuits, wherein, in the control signals inputted to the arithmetic operation circuit, in cases where there are count signal groups in a range between the count signal corresponding to the least significant bit flip-flop circuit and the count signal corresponding to the immediately preceding flip-flop circuit, the count signals from the flip-flop circuits corresponding to the count signal groups are obtained from assembling signals from the signal assembling circuits, so that the plurality of count signals outputted from the plurality of flip-flop circuits are outputted as output signals representing the counted values;

the count-signal groups have at least a first count-signal group and a second count-signal group which plurally sequentially handle the count signals from the least significant bit, and a third count-signal group, and said plurality of signal assembling circuits includes a first signal assembling circuit for entering directly and in parallel each count signal in said first count-signal group and for producing an output signal representative of a logical product of the count signals in the first count-signal group;

a second signal assembling circuit for entering directly and in parallel each count signal in said second count-signal group and for producing an output signal representative of a logical product of the count signals in the second count-signal group;

a third signal assembling circuit for entering directly and in parallel each count signal in said third count-signal and for producing an output signal representative of a logical product of the output signals from the third count-signal group; and a fourth signal assembling circuit for producing an output signal representative of a logical product of the output signals from the first, second and third count-signal groups, for outputting logical product signals as part of the control signals with respect to the flip-flop circuits higher in bit order than any one of the plurality of flip-flop circuits outputting the count signals composing the first, second and third count-signal groups.

7. A synchronous counter comprising:

an arithmetic operation circuit composed of flip-flop circuits which correspond in number to (n+1) flip-flops from the least significant (0)th bit to the most significant (n)th bit flip-flop, having a clock signal inputted thereto and operating in synchronization with the clock signal, for inverting the count signals composing corresponding (n+1) number output signals from the least significant (0)th bit count signals to the most significant (n)th bit count signals, to thereby represent the number of level inversions of the clock signal by the count signals; and a control circuit having a plurality of control signal outputting circuits having inputted thereto among the count signals the count signals of from the (0)th to the (i)th (where $1 \leq i \leq (n-1)$) bit count signal, producing logical product signals of the count signals from the (0)th to (i)th bit count signal to form control signals corresponding to the flip-flop circuits, and outputting these control signals to the arithmetic operation circuit to thereby invert the levels of the output signals from the first to (i+1)th flip-flop circuits, the control circuit including wiring groups which allow passage therethrough of the count signals in a plurality of count-signal groups for plurally sequentially grouping the count signals from the least significant bit, and a plurality of signal assembling circuits for producing logical product signals of the count signals in the count-signal groups, the control circuit being arranged to supply the control signals from the signal assembling circuits to the flip-flop circuits higher in bit order than any of the count signals composing the count-signal groups;

wherein said control circuit includes first and second wiring groups which allow passage therethrough of at least first and second count-signal groups for plurally sequentially handling the count signals from the least significant bit, and a third wiring group which allows passage therethrough of at least a third count-signal group;

a first signal assembling circuit for entering directly and in parallel each count signal in said first count-signal group and for producing an output signal representative of a logical product of the count signals in the first count-signal group;

a second signal assembling circuit for entering directly and in parallel each count signal in said second count-signal group and for producing an output signal representative of a logical product of the count signals in the second count-signal group;

a third signal assembling circuit for producing an output signal representative of a logical product of the output signal from the first signal assembling circuit and the output signal from the second signal assembling circuit;

a fourth signal assembling circuit for entering directly and in parallel with each count signal in said third count-signal group and for producing an output signal representative of a logical product of the count signals in the third count-signal group; and a fifth signal assembling circuit for producing an output signal representative of a logical product of the output signal from the third signal assembling circuit and the fourth signal assembling circuit;

wherein the control circuit is arranged to supply the control signal from the third signal assembling circuit with respect to the flip-flop circuits higher in bit order than any of the count signals composing the first and the second count-signal group; and said control circuit is arranged to supply said output signal from said third assembling circuit and said output signal from said fifth signal assembling circuit with respect to flip-flop circuits higher in bit order than any count signals in the first, second and third count-signal groups.

8. A synchronous counter comprising:

an arithmetic operation circuit composed of (n+1) flip-flop circuits, having a clock signal inputted thereto and operating in synchronization with the clock signal, and inverting the levels of the count signals composing corresponding (n+1) output signals from the least significant (0)th to the most significant (n)th bit output signals to thereby represent the number of level inversions of the clock signals by the count signals; and a control circuit including a plurality of control signal output circuits having inputted thereto those of the count signals from the (0)th to the (i)th (wherein $1 \leq i \leq (n-1)$ bit count signal, producing logical product signals of the count signals from the (0)th to the (i)th bit count signal to thereby form control signals corresponding to flip-flop circuits, and outputting the control signals to the arithmetic operation circuit and thereby inverting the levels of the output signals from the first to (i+1)th flip-flop circuits, and the control circuit further including wiring groups which allow passage therethrough of a plurality of count-signal groups for plurally sequentially assembling the count signals from the least significant bit, and a plurality of signal assembling circuits for producing logical product signals of the count signals in the count-signal groups, wherein the control circuit is arranged to supply the control signals from the output signals of the signal assembling circuits and the (0)th bit count signals;

the count-signal groups have at least a first count-signal group and a second count-signal group which plurally sequentially handle the count signals from the least significant bit, and a third count-signal group, and said plurality of signal assembling circuits includes a first signal assembling circuit for entering directly and in parallel each count signal in said first count-signal group and for producing an output signal representative of a logical product of the count signals in the first count-signal group;

a second signal assembling circuit for entering directly and in parallel each count signal in said second count-signal group and for producing an output signal representative of a logical product of the count signals in the second count-signal group;

a third signal assembling circuit for entering directly and in parallel each count signal in said third count-signal group and for producing an output signal representative of a logical product of the output signals from the third count-signal group; and a fourth signal assembling circuit for producing an output signal representative of a logical product of the output signals from the first, second and third count-signal groups, for outputting logical product signals as part of the control signals with respect to the flip-flop circuits higher in bit order than any one of the plurality of flip-flop circuits outputting the count signals composing the first, second and third count-signal groups.

9. A synchronous counter comprising:

an arithmetic operation circuit composed of first to (n+1) flip-flop circuits, having a clock signal inputted thereto and operating in synchronization with the clock signal, for inverting the levels of the count signals composing its corresponding (n+1) output signals for from the least significant (0)th bit to the most significant (n)th bit output signal to thereby represent the number of the clock signals inputted thereto by the count signals; and a control circuit including a plurality of control signal outputting circuits having inputted thereto among the count signals the count signals from the (0)th to (i)th (wherein $1 \leq i \leq (n-1)$) bit count signal, producing logical product signals of the count signals of from the (0)th to (i)th bit count signal to form control signals corresponding to the flip-flop circuits, and outputting these control signals to the arithmetic operation circuit to thereby invert the levels of the output signals from the first to (i+1)th flip-flop circuits, wherein the control circuit includes a first and a second wiring group which allow passage therethrough of the count signals in a first and a second count-signal group for plurally sequentially grouping the count signals from the least significant bit, and a signal assembling circuit which is a final control signal outputting circuit in the first count-signal group and which is intended for producing a logical product signal of all the count signals in the first count-signal group, the control signal outputting circuit having inputted thereto the count signals in the second count-signal group being arranged to obtain from the output signals of the signal assembling circuit the logical product signals of the count signals lower in bit order than any one of the count signals composing the second count-signal group, and the control circuit being arranged to supply the control signals from the signal assembling circuits to the flip-flop circuits corresponding to the count signals composing the second counts signal group;

wherein the count-signal groups have at least a first count-signal group and a second count-signal group which plurally sequentially handle the count signals from the least significant bit, and a third count-signal group, and said plurality of signal assembling circuits includes a first signal assembling circuit for entering directly and in parallel each count signal in said first count-signal group and for producing an output signal representative of a logical product of the count signals in the first count-signal group;

a second signal assembling circuit for entering directly and in parallel each count signal in said second count-signal group and for producing an output signal representative of a logical product of the count signals in the second count-signal group;

a third signal assembling circuit for entering directly and in parallel each count signal in said third count-signal group and for producing an output signal representative of a logical product of the output signals from the third count-signal group; and a fourth signal assembling circuit for producing an output signal representative of a logical product of the output signals from the first, second and third count-signal groups, for outputting logical product signals as part of the control signals with respect to the flip-flop circuits higher in bit order than any one of the plurality of flip-flop circuits outputting the count signals composing the first, second and third count-signal groups.

10. The synchronous counter according to claim 9, wherein the first flip-flop circuit is intended to obtain the count signal corresponding to the (0)th bit which is the least significant bit by performing frequency division of the clock signal, a count signal is supplied to the second flip-flop circuit as a control signal which is outputted from the first flip-flop circuit and, when this control signal has one logical level, the second flip-flop circuit inverts the level of the (1)th bit count signal in synchronization with the clock signal, and the third to (n+1)th flip-flops have control signals inputted thereto and, when the control signals have one logical levels, invert the levels of the second to (n)th bit count signals in synchronization with the clock signals.

11. A counter circuit comprising:

a plurality of signal groups including a least significant signal group and a most significant signal group, each of said signal groups including a plurality of flip-flops, each of said flip-flops having a clock input for receiving a signal including pulses to be counted, a control input and an output for providing a bit of an output of said counter, said least significant signal group being for providing least significant bits of said counter output and said most significant signal group being for providing most significant bits of said counter output;

wherein a signal group further includes a first logic gate, for receiving an output of a flip-flop for generating a least significant bit in said signal group as a first input and a signal representative of a logical product of outputs of flip-flops in signal groups less significant than said signal group as a second input, and for providing a signal representative of a logical product of said first and second inputs as an output to a control input of a flip-flop generating a next-to-least significant bit in said signal group; and a logic circuit, for receiving said received signal received as said second input of said first logic gate as a first input, for receiving outputs of flip-flops in said signal group as additional inputs, and for generating a signal representative of a logical product of said inputs of said third logic gate as an output to a control input of a flip-flop for generating a least significant bit of a next-most significant signal group.

12. The circuit of claim 11, said signal group further comprising:

an additional first logic gate, for receiving said signal representative of said logical product of outputs of flip-flops in signal groups less significant than said signal group as a first input, for receiving as a plurality of inputs a plurality of outputs of flip-flops in said signal group which are for generating bits in said signal group that are less significant than a bit corresponding to said additional first logic gate, and for providing a signal representative of a logical product of said first and plurality of inputs as an output to a control input of a flip-flop generating a next-most significant bit in said signal group.

13. The circuit of claim 11, said logic circuit comprising:

a second logic gate, for receiving outputs of flip-flops in said signal group as inputs, and for providing a signal representative of a logical product of said inputs as an output of said second logic gate; and a third logic gate, for receiving said output of said first logic gate as a first input and said signal received as said second input of said first logic gate as a second input, and for generating a signal representative of a logical product of said fist and second inputs of said third logic gate as an output to a control input of a flip-flop for generating a least significant bit of a next-most significant signal group.

14. The circuit of claim 13, said signal group further comprising:

a plurality of subsidiary second logic gates, said subsidiary logic gates each for receiving as a plurality of inputs outputs of a plurality of flip-flops in said signal group, and for providing a signal representative of a logical product of said flip-flop outputs as an input of said second logic gate.

15. A counter circuit comprising:

a plurality of signal groups including a least significant signal group and a most significant signal group, each of said signal groups including a plurality of flip-flops, each of said flip-flops having a clock input for receiving a signal including pulses to be counted, a control input and an output for providing a bit of an output of said counter, said least significant signal group being for providing least significant bits of said counter output and said most significant signal group being for providing most significant bits of said counter output;

wherein a signal group further includes a first logic gate, for receiving a signal representative of a logical product of outputs of flip-flops in signal groups less significant than said signal group as a first input and an output of a flip-flop for generating a least significant bit in said counter output as a second input, and for providing a signal representative of a logical product of said first and second inputs as an output to a control input of a flip-flop generating a next-to-least significant bit in said signal group;

a second logic gate, for receiving an output of said flip-flop generating said least significant bit in said signal group as a first input, said signal representative of a logical product of outputs of flip-flops in signal groups less significant than said signal group as a second input, and said output of said flip-flop for generating said least significant bit in said counter output as a third input, and for providing a signal representative of a logical product of said first, second and third inputs as an output to a control input of a flip-flop generating a next-to-least significant bit in said signal group;

a third logic gate, for receiving outputs of flip-flops in said signal group as inputs, and for providing a signal representative of a logical product of said inputs as an output of said third logic gate; and a fourth logic gate, for receiving said signal received as said first input of said first logic gate as a first input and said output of said third logic gate as a second input and for generating a signal representative of a logical product of said first, second and third inputs of said third logic gate as an output to a control input of a flip-flop for generating a least significant bit of a next-most significant signal group.

16. The circuit of claim 15, said signal group further comprising:

an additional second logic gate, for receiving said signal representative of said logical product of outputs of flip-flops in signal groups less significant than said signal group as a first input, for receiving as a second input said output of said flip-flop for generating said least significant bit in said counter output, for receiving as a plurality of inputs a plurality of outputs of flip-flops in said signal group which are for generating bits in said signal group that are less significant than a bit corresponding to said additional first logic gate, and for providing a signal representative of a logical product of said first, second and plurality of inputs as an output to a control input of a flip-flop generating a next-most significant bit in said signal group.

* * * * *